(12) United States Patent
Seo et al.

(10) Patent No.: US 7,952,089 B2
(45) Date of Patent: May 31, 2011

(54) COMPOSITE MATERIAL AND LIGHT EMITTING ELEMENT

(75) Inventors: Satoshi Seo, Kanagawa (JP); Ryoji Nomura, Kanagawa (JP); Takako Takasu, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 916 days.

(21) Appl. No.: 11/665,305

(22) PCT Filed: Oct. 17, 2005

(86) PCT No.: PCT/JP2005/019433
§ 371 (c)(1),
(2), (4) Date: Apr. 12, 2007

(87) PCT Pub. No.: WO2006/043678
PCT Pub. Date: Apr. 27, 2006

(65) Prior Publication Data
US 2008/0135835 A1    Jun. 12, 2008

(30) Foreign Application Priority Data
Oct. 22, 2004   (JP) ................. 2004-308938

(51) Int. Cl.
*H01L 51/54* (2006.01)
(52) U.S. Cl. ............. 257/40; 257/103; 257/E51.018; 257/E51.026; 257/E21.046; 257/E51.051
(58) Field of Classification Search ........... 257/40, 257/79, E51.018, E51.019, E51.026, E51.046, 257/E51.051, 103
See application file for complete search history.

(56) References Cited

U.S. PATENT DOCUMENTS

| | | | | |
|---|---|---|---|---|
| 4,563,300 A | * | 1/1986 | Wynne et al. | 252/519.21 |
| 4,563,301 A | * | 1/1986 | Marks et al. | 252/519.2 |
| 4,622,170 A | * | 11/1986 | Wynne et al. | 252/519.21 |
| 4,839,112 A | * | 6/1989 | Wynne et al. | 264/435 |

(Continued)

FOREIGN PATENT DOCUMENTS

EP    0 855 848 A2    7/1998

(Continued)

OTHER PUBLICATIONS

International Search Report re application No. PCT/JP2005/019433, dated Jan. 31, 2006.

(Continued)

*Primary Examiner* — Anh Phung
*Assistant Examiner* — Michael Lulis
(74) *Attorney, Agent, or Firm* — Husch Blackwell LLP

(57) ABSTRACT

An object of the invention is to provide a composite material with which a light emitting element can be manufactured to have superior heat resistance, and another is to have durability high enough to be driven stably for a long time. Another object is to provide a composite material with which a light emitting element can be manufactured to achieve both objects. Still another object is to provide a composite material with which a light emitting element can be manufactured to achieve the above objects and to have little increase in power consumption. One feature of a composite material of the invention which can achieve the above objects is to comprise an organic-inorganic hybrid material in which an organic group is covalently bonded to silicon in a skeleton composed of siloxane bonds, and a material which is capable of accepting or donating electrons from or to the organic group.

10 Claims, 13 Drawing Sheets

U.S. PATENT DOCUMENTS

| | | | |
|---|---|---|---|
| 5,834,100 A * | 11/1998 | Marks et al. | 428/209 |
| 6,013,384 A | 1/2000 | Kido et al. | |
| 6,586,763 B2 * | 7/2003 | Wang et al. | 257/40 |
| 6,939,625 B2 * | 9/2005 | Marks et al. | 428/690 |
| 7,449,509 B2 * | 11/2008 | Marks et al. | 524/188 |
| 2003/0189401 A1 | 10/2003 | Kido et al. | |
| 2004/0092195 A1 * | 5/2004 | Marks et al. | 445/24 |
| 2004/0187917 A1 * | 9/2004 | Pichler | 136/263 |
| 2005/0158579 A1 * | 7/2005 | Marks et al. | 428/690 |
| 2009/0062440 A1 * | 3/2009 | Marks et al. | 524/188 |

FOREIGN PATENT DOCUMENTS

| | | |
|---|---|---|
| EP | 1 351 558 A1 | 10/2003 |
| JP | 10-270172 | 10/1998 |
| JP | 2000-306669 | 11/2000 |
| JP | 2003-272860 | 9/2003 |
| JP | WO 2005/064995 A1 | 7/2005 |
| JP | 2005-209643 | 8/2005 |
| JP | 2006-13458 | 1/2006 |
| WO | WO 2005/115060 A1 | 12/2005 |

OTHER PUBLICATIONS

Written Opinion re application No. PCT/JP2005/019433, dated Jan. 31, 2006.

Adachi, C. et al, "Electroluminescence in Organic Films with Three-Layer Structure," Japanese Journal of Applied Physics, vol. 27, No. 2, Feb. 1988, pp. L269-L271.

Dantas de Morais, T. et al, "Hybrid Organic-Inorganic Light-Emitting Diodes," Advanced Materials, vol. 11, No. 2, 1999, pp. 107-112.

* cited by examiner

COMPOSITE MATERIAL AND LIGHT EMITTING ELEMENT

TECHNICAL FIELD

The present invention relates to a material used for a light emitting element. The invention also relates to an element which includes a light emitting material containing an organic material sandwiched between electrodes and emits light by applying current between the electrodes (light emitting element), and particularly to a light emitting element with superior heat resistance and little deterioration in luminance associated with accumulation of light emitting time.

BACKGROUND ART

In recent years, a light emitting device or a display using a light emitting element formed with an organic material has been actively developed. The light emitting element is manufactured by sandwiching an organic compound between a pair of electrodes. Unlike a liquid crystal display device, the light emitting element itself emits light and does not require a light source such as backlight. In addition, the element itself is very thin. Therefore, the light emitting element is very advantageous to manufacture a thin lightweight display.

In a light emitting mechanism of the light emitting element, it is said that an electron injected from a cathode is recombined with a hole injected from an anode at a light emitting center of the organic compound to form a molecular exciton and the molecular exciton releases energy to emit light when returning to a ground state. A singlet excited state and a triplet excited state are known as excited states, and it is thought that light emission can be obtained through either of the excitation states.

An organic compound layer sandwiched between electrodes often has a laminated structure. A typical example of the laminated structure is functionally-separated laminated structure, for example, "hole transporting layer/light emitting layer/electron transporting layer". By placing a layer of a highly hole transporting material on an electrode (serving as an anode) side and a layer of a highly electron transporting material on a cathode side, with a light emitting layer in which electrons are recombined with holes sandwiched therebetween, electrons and holes can be efficiently transported. Further, probability that electrons are recombined with holes can be increased. Since such a structure achieves very high emission efficiency, most of light emitting display devices which has currently been researched and developed employ this structure (for example, Reference 1: Chihaya Adachi et al., Japanese Journal of Applied Physics, Vol. 27, No. 2, 1988, pp. L269-L271).

In another structure, a hole injecting layer, a hole transporting layer, a light emitting layer, and an electron transporting layer, or a hole injecting layer, a hole transporting layer, a light emitting layer, an electron transporting layer and an electron injecting layer are sequentially laminated over an electrode serving as an anode. Each layer is formed with a material specific to each function. Note that a layer having two or more of these functions, for example, a layer having both functions of the light emitting layer and the electron transporting layer, may be used.

Although a layer containing an organic compound typically has a laminated structure as described above, it may be a single layer or be a mixed layer. In addition, the light emitting layer may be doped with a fluorescent pigment or the like.

Meanwhile, such a light emitting element has a problem in durability and heat resistance. Since such a light emitting element is formed by laminating an organic thin film containing an organic compound as described above, fragility of the thin film of the organic compound is considered as a cause for that.

On the other hand, there is an example of manufacturing a light emitting element using not an organic thin film but a layer in which an organic compound (a hole transporting compound, an electron transporting compound, or a light emitting compound) is dispersed in a skeleton composed of siloxane bonds (for example, Reference 2: Japanese Patent Laid-Open No. 2000-306669, and Reference 3: Tony Dantas de Morais et al., Advanced Materials, Vol. 11, No. 2, pp. 107-112 (1999)). Note that Reference 2 also reports that durability and heat resistance of the element are improved.

However, in the light emitting element disclosed in Reference 2 or 3, an organic compound is dispersed in a skeleton composed of insulating siloxane bonds. Therefore, current is hard to flow therethrough as compared with a conventional light emitting element.

Luminance of the light emitting element becomes high in proportion to the amount of current to flow therethrough. Thus, difficulty in flowing current through the light emitting element leads to an increase in voltage for obtaining a predetermined luminance (drive voltage), which results in higher power consumption.

In order to reduce short circuits in a light emitting element caused by dust or the like, it is effective to increase the thickness of the light emitting element. However, when the thickness of the light emitting element having such a structure as disclosed in Reference 2 or 3 is increased, drive voltage is markedly increased.

DISCLOSURE OF INVENTION

It is an object of the invention to provide a composite material with which a light emitting element can be manufactured to have superior heat resistance. It is another object of the invention to provide a composite material with which a light emitting element can be manufactured to have durability high enough to be driven stably for a long time. It is still another object to provide a composite material with which a light emitting element can be manufactured to achieve both objects. It is yet another object to provide a composite material with which a light emitting element can be manufactured to achieve the above objects and to have little increase in power consumption.

It is also an object to provide a composite material which easily prevents a short circuit between electrodes in a light emitting element and with which a light emitting element can be manufactured to consume less power.

Further, it is an object of the invention to provide a light emitting element having superior heat resistance. It is another object to provide a light emitting element having durability high enough to be driven stably for a long time. In addition, it is still another object to provide a light emitting element which achieves both objects. It is yet another object to provide a light emitting element which achieves the above objects and has little increase in power consumption.

It is also an object to provide a light emitting element which tends to prevent a short circuit between electrodes therein and consumes less power.

One feature of a composite material of the invention which can achieve the above objects is to comprise an organic-inorganic hybrid material in which an organic group is covalently bonded to silicon in a skeleton composed of siloxane bonds, and a material which is capable of accepting or donating electrons from or to the organic group.

Note that the organic-inorganic hybrid material refers to a material formed by bonding an organic material and an inorganic material to each other. In the invention, the organic-inorganic material refers mainly to a material in which an organic group is bonded to a part of silicon in a skeleton composed of siloxane bonds.

One feature of a light emitting element of the invention which can achieve the above objects is to comprise a pair of electrodes, a light emitting layer which emits light by applying current between the pair of electrodes, and at least one layer of a composite material having an organic-inorganic hybrid material in which an organic group is covalently bonded to silicon in a skeleton composed of siloxane bonds and a material which is capable of accepting or donating electrons from or to the organic group between the pair of electrodes.

A light emitting element using a composite material of the invention having the above structure can be provided with superior heat resistance. In addition, the light emitting element using a composite material of the invention having the above structure can be driven stably for a long time. Further, the light emitting element using a composite material of the invention having the above structure can be provided with superior heat resistance and can be driven stably for a long time. Moreover, as to the light emitting element using a composite material of the invention, there is little increase in power consumption in addition to the above effects.

A light emitting element of the invention having the structure can be provided with superior heat resistance. In addition, the light emitting element of the invention having the above structure can be driven stably for a long time. Further, the light emitting element of the invention having the above structure can be provided with superior heat resistance and can be driven stably for a long time. Moreover, as to the light emitting element of the invention having the above structure, there is little increase in power consumption in addition to the above effects.

A light emitting element which easily prevents a short circuit and consumes less power can be provided.

BEST MODE FOR CARRYING OUT THE INVENTION

Embodiments of the present invention will be explained with reference to the drawings. However, the present invention is not limited to the following description. As is easily known to a person skilled in the art, the mode and the detail of the invention can be variously changed without departing from the spirit and the scope of the present invention. Thus, the present invention is not interpreted while limiting to the following description of the embodiments.

Note that an electrode of a pair of electrodes in a light emitting element of the invention, to which voltage is applied so as to have a high potential when light emission is obtained, is referred to as an electrode serving as an anode, and an electrode to which voltage is applied so as to have a low potential when light emission is obtained is referred to as an electrode serving as a cathode.

In the invention, a hole injecting-transporting layer and a hole transporting layer refer to a layer formed of a material having a higher hole transporting property than an electron transporting property and located closer to an electrode serving as an anode than a light emitting layer, and an electron injecting-transporting layer and an electron transporting layer refer to a layer formed of a material having a higher electron transporting property than a hole transporting property and located closer to an electrode serving as a cathode than the light emitting layer, unless otherwise noted. Alternatively, a layer having both functions of them may be used. Further, the light emitting layer may also have any of the functions.

Embodiment 1

Figure 1:
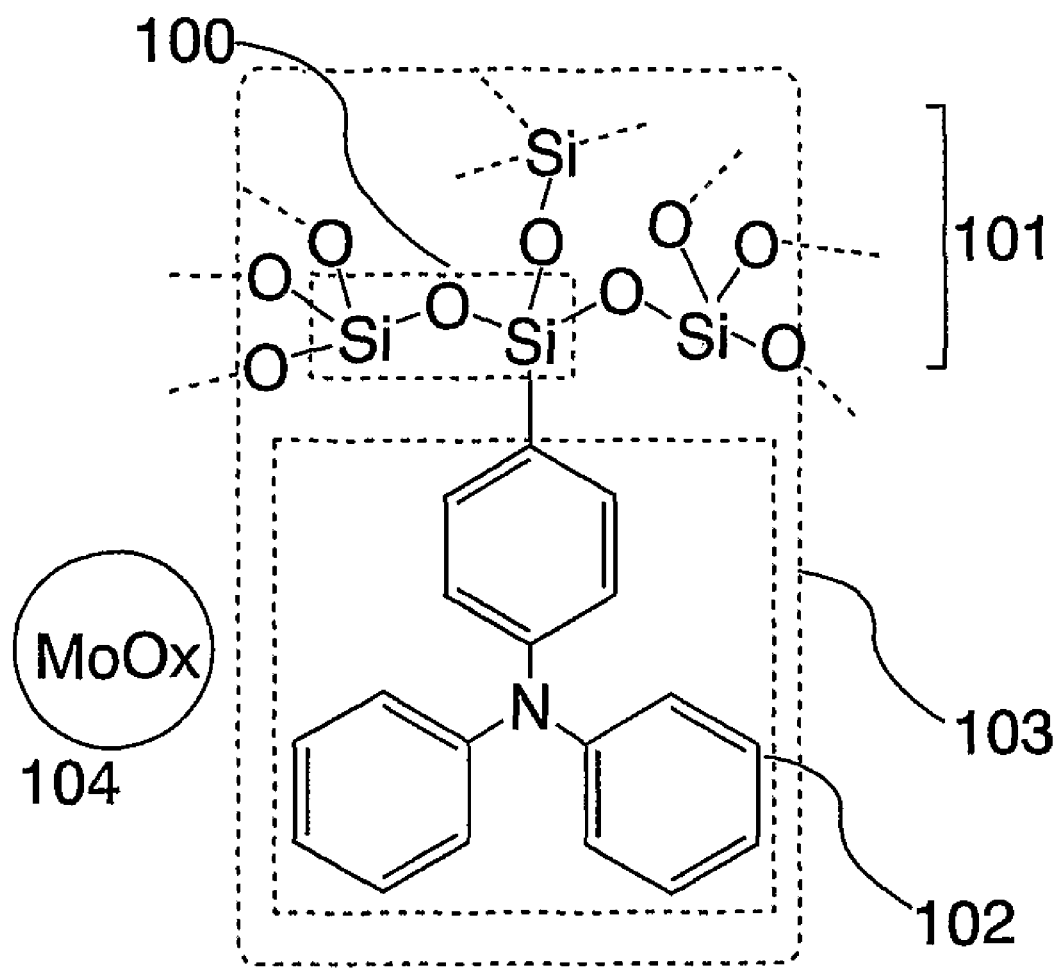
FIG. 1 is a schematic diagram of a composite material of the present invention.
Figure 2:
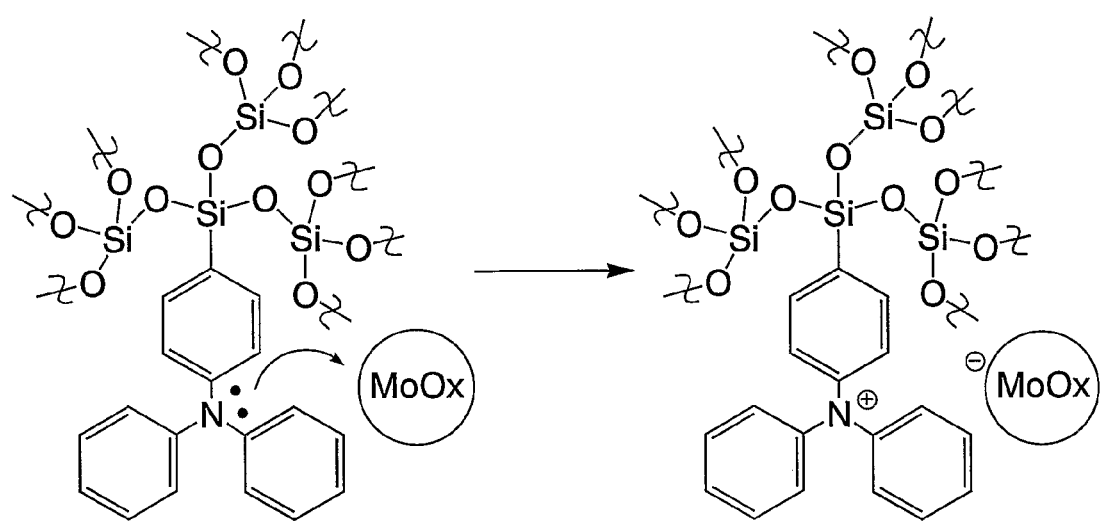
FIG. 2 is a schematic diagram showing electron transfer in a composite material of the invention.

A composite material of the invention, as shown in its schematic diagram of FIG. 1, has an organic-inorganic hybrid material 103 in which an organic group 102 is covalently bonded to silicon in a skeleton 101 having a siloxane bond 100, to which a material 104 capable of transferring electrons to and from the organic group is further added. Then, electrons or holes are generated by transferring electrons as shown in its schematic diagram of FIG. 2 to improve an electron or hole injecting property or conductivity of the composite material. FIG. 2 is a schematic diagram showing that, by making molybdenum oxide contained in a silica matrix having a triphenylamino group, the molybdenum oxide accepts an unpaired electron of the triphenylamino group and a hole is thus generated in the triphenylamino group.

The composite material of the invention has superior heat resistance and durability because of including a skeleton composed of siloxane bonds. In addition, an organic group is covalently bonded to silicon in the skeleton. Accordingly, a material including a skeleton composed of siloxane bonds can be provided with a hole or electron injecting or transporting property the organic group has. In addition, a material which is capable of accepting or donating electrons from or to the organic group in the organic-inorganic hybrid material is added to the composite material. Accordingly, a hole or electron injecting or transporting property can be enhanced, and further, conductivity can be enhanced.

First, a composite material which can be used for a hole injecting layer or a hole transporting layer is explained.

The organic group which covalently bonds to silicon in the skeleton composed of siloxane bonds and provides the skeleton with a hole injecting and/or hole transporting properties preferably has an arylamine skeleton or a pyrrole skeleton. The organic-inorganic hybrid material in the composite material of the invention can be obtained by polycondensing alkoxysilane in which the organic group having the above-described skeleton is covalently bonded to silicon. Alternatively, it can be obtained by polycondensation using both alkoxysilane including the organic group having the above-described skeleton and tetraalkoxysilane. An example of such alkoxysilane including the organic group can be as follows: the following structural formulae (1) to (3) as alkoxysilane including an organic group having an arylamine skeleton; the following structural formulae (4) to (6) as alkoxysilane including an organic group having a pyrrole skeleton; and the following structural formula (7) as alkoxysilane including an organic group having both an arylamine skeleton and a pyrrole skeleton. Note that one or plural kinds of alkoxysilane including an organic group may be used. In the case of using alkoxysilane having plural kinds of organic groups, a composite material in which plural kinds of organic groups are covalently bonded to silicon in the skeleton composed of siloxane bonds can be obtained.

[Formula (1)]

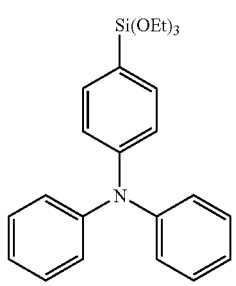

(1)

[Formula (2)]

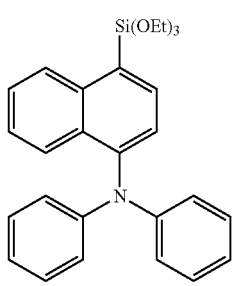

(2)

[Formula (3)]

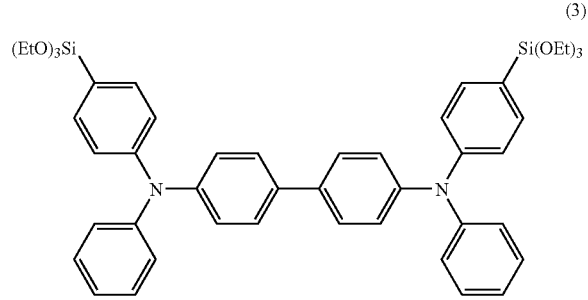

(3)

[Formula (4)]

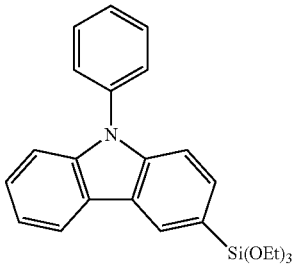

(4)

[Formula (5)]

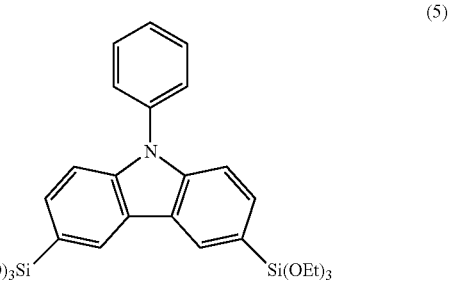

(5)

[Formula (6)]

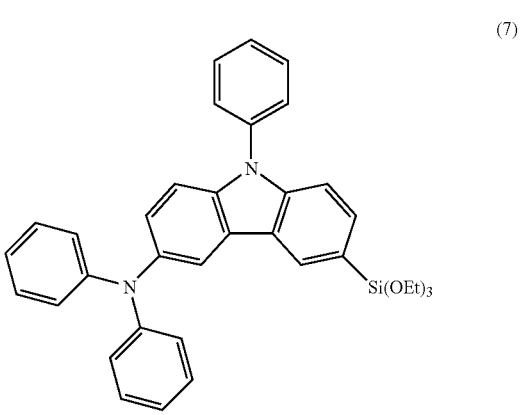

(6)

[Formula (7)]

(7)

As a material which is capable of accepting electrons from the organic group and improve hole injecting and/or hole transporting properties of a composite material, oxide or hydroxide of transition metal having an electron accepting property can be used. One or plural kinds of these may be used. For example, oxide or hydroxide of titanium, vanadium, molybdenum, tungsten, rhenium, ruthenium, or niobium can be specifically used; however, the invention is not limited thereto.

A composite material which can be used for the hole injecting layer or the hole transporting layer can be manufactured by adding one kind or plural kinds of the above materials which is capable of accepting electrons from the organic group to the organic-inorganic hybrid material in which the organic group in alkoxysilane as shown in the structural formulae (1) to (7) is covalently bonded to silicon in the skeleton composed of siloxane bonds. Since hole carriers are generated in the composite material of the invention as described above unlike a conventional organic-inorganic hybrid material, the composite material has highly hole injecting and transporting properties and also high conductivity.

Next, a composite material which can be used for an electron injecting layer or an electron transporting layer is explained.

The organic group which covalently bonds to silicon in the skeleton composed of siloxane bonds and provides the skeleton composed of siloxane bonds with an electron injecting and/or electron transporting properties preferably has a pyridine skeleton, a phenanthroline skeleton, a quinoline skeleton, a pyrazine skeleton, a triazine skeleton, an imidazole skeleton, a triazole skeleton, an oxadiazole skeleton, a thiadiazole skeleton, an oxazole skeleton, or a thiazole skeleton. The organic-inorganic hybrid material in the composite material of the invention can be obtained by polycondensing alkoxysilane in which the organic group having the above-described skeleton is covalently bonded to silicon. Alternatively, it can be obtained by polycondensation using both alkoxysilane including the organic group having the above-described skeleton and tetraalkoxysilane. An example of such alkoxysilane including the organic group can be as follows: the following structural formulae (8) to (14) as alkoxysilane including an organic group having a pyridine skeleton (in particular, the following structural formulae (10) to (13) represent phenanthroline skeletons and (14) represents a quinoline skeleton), the following structural formula (15) as alkoxysilane including an organic group having a pyrazine skeleton, the following structural formula (16) as alkoxysilane including an organic group having a triazole skeleton, the following structural formula (17) as alkoxysilane including an organic group having an imidazole skeleton, the following structural formula (18) as alkoxysilane including an organic group having an oxadiazole skeleton, the following structural formula (19) as alkoxysilane including an organic group having a thiadiazole skeleton, the following structural formula (20) as alkoxysilane including an organic group having an oxazole skeleton, or the following structural formula (21) as alkoxysilane including an organic group having a thiazole skeleton. Note that one or plural kinds of alkoxysilane including these organic groups may be used. In the case of using alkoxysilane including plural kinds of organic groups, a composite material in which plural kinds of organic groups are covalently bonded to silicon in the skeleton composed of siloxane bonds can be obtained.

[Formula (8)]

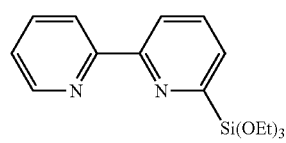

(8)

[Formula (9)]

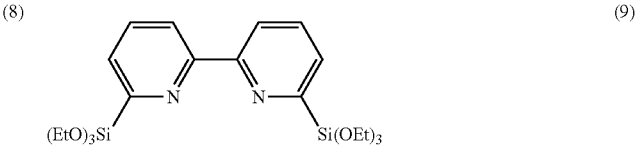

(9)

[Formula (10)]

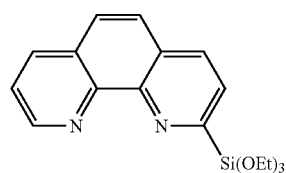

(10)

[Formula (11)]

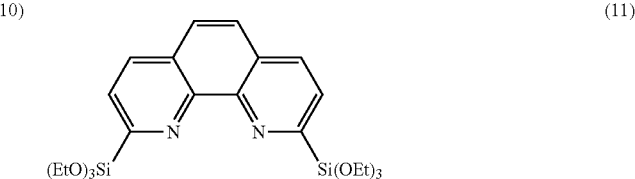

(11)

[Formula (12)]

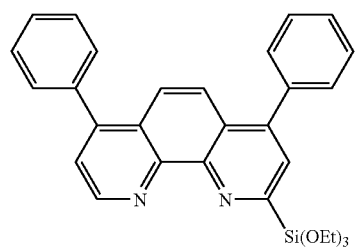

(12)

[Formula (13)]

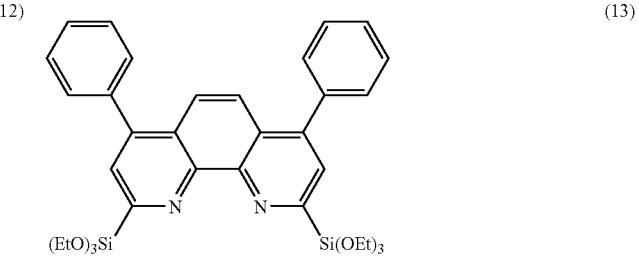

(13)

[Formula (14)]
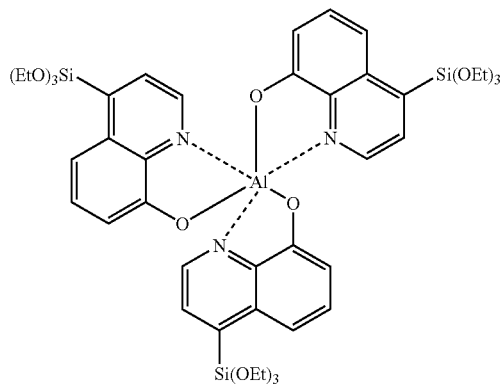
(14)
[Formula (15)]
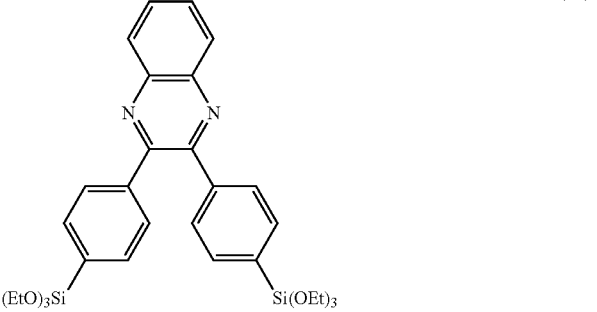
(15)
[Formula (16)]
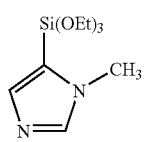
(16)
[Formula (17)]
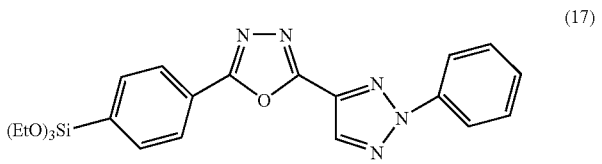
(17)
[Formula (18)]
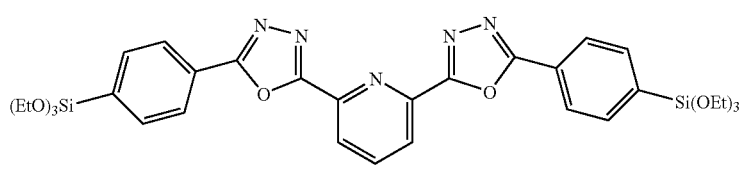
(18)
[Formula (19)]
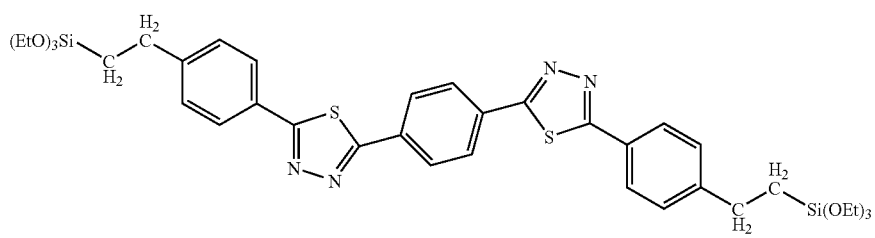
(19)
[Formula (20)]
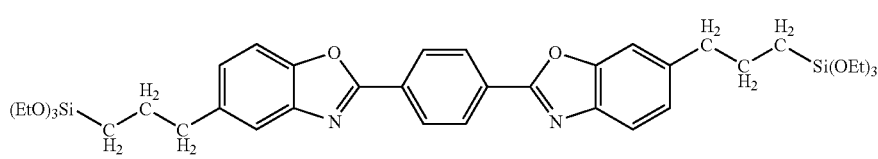
(20)
[Formula (21)]
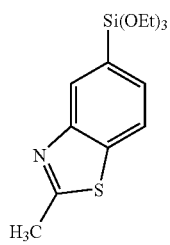
(21)

As a material which is capable of donating electrons to the organic group and improve electron injecting and/or electron transporting properties of a composite material, an electron donating material is preferable and oxide or hydroxide of alkali metal or alkaline earth metal can be used. One or plural kinds of them are used. For example, oxide or hydroxide of lithium or barium can be specifically, but not exclusively, used.

A composite material which can be used for the electron injecting layer or the electron transporting layer can be manufactured by adding one or plural kinds of the above materials which is capable of donating electrons to the organic group to the organic-inorganic hybrid material in which the organic group as shown in the structural formulae (8) to (21) is covalently bonded to silicon in the skeleton composed of siloxane bonds. Since electron carriers are generated in the composite material of the invention as described above unlike a conventional organic-inorganic hybrid material, the composite material has highly electron injecting and transporting properties and also high conductivity.

Note that this embodiment can be combined with another embodiment as long as it is consistent.

Embodiment 2

A method for manufacturing a composite material as described in Embodiment 1 using a sol-gel method with an alkoxide method is described in this embodiment.

First, tetraethoxysilane and/or methyltriethoxysilane, and alkoxysilane in which an organic group capable of providing a skeleton composed of siloxane bonds with a hole injecting or transporting property or an electron injecting or transporting property is covalently bonded to silicon in the skeleton, described in Embodiment 1 are dissolved in an acid or alkaline solvent (for example, lower alcohol or the like) to make Solution 1. When the acid or alkaline solvent is used, polycondensation is performed on tetraethoxysilane and/or methyltriethoxysilane, and alkoxysilane including an organic group to form a sol. When a state after the polycondensation is acidic, the sol becomes fibrous. When alkaline, it becomes aggregated. Therefore, Solution 1 is preferably acidic. Solution 1 preferably has a pH of approximately 1 to 3.

In Solution 1, the polycondensation may be further promoted by performing either or both heat stir and maturation. The heat stir may be performed at several tens of degrees Celsius for several hours, and the maturation may be performed at room temperature for approximately over ten hours to twenty four hours.

Solution 1 may be made with only alkoxysilane including an organic group without using tetraethoxysilane and/or methyltriethoxysilane. However, a molar ratio of tetraethoxysilane and/or methyltriethoxysilane to alkoxysilane including an organic group is preferably in the range of 10:1 to 1:10. The molar ratio of tetraethoxysilane and/or methyltriethoxysilane to alkoxysilane including an organic group is more preferably in the range of 5:1 to 1:5.

Subsequently, a sol of a metal alkoxide-organic solvent solution of metal in metal oxide which is capable of accepting or donating electrons from or to the organic group is formed (Solution 2). In addition, water or β-diketone or the like as a stabilizer may be added to Solution 2. As the stabilizer, β-diketone typified by acetylacetone, ethyl acetoacetate, or benzoylacetone can be used.

As the organic solvent, lower alcohols, tetrahydrofuran, acetonitrile, chloroform, dichloroethane, chlorobenzene, acetone, or the like can be given, and they may be used alone or by mixing them. As the lower alcohols, methanol, ethanol, n-propanol, n-butanol, sec-butanol, tert-butanol, or the like can be used.

As the metal alkoxide, ethoxide, n-propoxide, isopropoxide, n-butoxide, sec-butoxide, tert-butoxide, or the like can be used. Note that the above alkoxide is preferably liquid or easy to dissolve in an organic solvent.

Then, a composite material in which a material capable of transferring electrons to and from an organic group is added to an organic-inorganic hybrid material where an organic group is covalently bonded to silicon in a skeleton composed of siloxane bonds can be manufactured by adding Solution 2 to Solution 1, and then stirring, applying, and baking (at 100° C. to 300° C. for several hours) the mixture. The baking may be performed in the atmosphere, in an inert atmosphere of nitrogen or the like, or in a vacuum. At this time, a ratio of the number of moles of the organic group which can provide the skeleton composed of siloxane bonds with a hole injecting or transporting property or an electron injecting or transporting property to the number of moles of metal alkoxide in Solution 2 is preferably in the range of 5:1 to 1:5, more preferably, 2:1 to 1:2.

The application can be performed by a wet coating method, for example, a dip coating method, a spin coating method, or a droplet application method such as an inkjet method.

A light emitting element can be provided with superior heat resistance by using the composite material of the invention for a functional layer of the light emitting element. In addition, the light emitting element can be driven stably for a long time.

Note that Solution 2 may be a metal alkoxide-organic solvent solution alone, but it preferably includes a mild chelating agent such as β-diketone as a stabilizer so as not to cause precipitation when mixed with Solution 1. As the stabilizer, β-diketone typified by acetylacetone, ethyl acetoacetate, or benzoylacetone can be used.

Water is added to hydrolyze and polycondense metal alkoxide. However, hydrolysis of metal alkoxide is not necessarily required. If precipitation is caused when water is added, a mild chelating agent such as β-diketone is preferably added as a stabilizer. The stabilizer is preferably a material which is removed from metal by baking. As the stabilizer, β-diketone typified by acetylacetone, ethyl acetoacetate, or benzoylacetone can be used.

Note that the amount of the stabilizer with respect to the metal alkoxide is preferably 0.1 to 2 equivalents, more preferably, 0.5 to 1 equivalent.

The composite material of the invention manufactured in this manner has a structure in which an organic group is bonded to a skeleton composed of siloxane bonds and metal oxide and/or metal hydroxide are dispersed in the skeleton. In addition, it has a structure in which the metal oxide is incorporated in a skeleton partly having a siloxane bond (in other words, a structure having a metal-oxygen-silicon bond).

Since a material capable of transferring electrons to and from an organic group covalently bonded to silicon in a siloxane bond is added to the composite material, conductivity and a carrier injecting or transporting property of the composite material are improved. By using the composite material for a functional layer of a light emitting element, the light emitting element can be provided with superior heat resistance and driven stably for a long time without increasing power consumption.

Note that the composite material of the invention is superior in conductivity to a conventional organic-inorganic hybrid material. Therefore, there is little increase in drive voltage of a light emitting element using the composite material for a functional layer even when the functional layer is formed to be thick. Consequently, the functional layer between an electrode of a pair of electrodes in the light emitting element, which is formed before the other, and a light emitting layer can be formed to be thick, so that generation of short circuits in the light emitting element due to dust or the like can be reduced. A thickness of 100 nm or more can effectively reduce such defects.

Since the functional layer formed to be thick contains a material which is capable of accepting or donating electrons from or to an organic group covalently bonded to silicon in a siloxane bond, conductivity and a carrier injecting or transporting property are improved. Thus, generation of short circuits in the light emitting element due to dust or the like can be reduced without significantly increasing drive voltage, in other words, without significantly increasing power consumption.

Subsequently, an example of manufacturing a composite material which can be used for a hole injecting-transporting layer of a light emitting element is specifically given. In this embodiment, the composite material of the invention is manufactured using, as an example, a triphenylamino group as the organic group covalently bonded to silicon in a siloxane bond and molybdenum oxide as a material which is capable of accepting or donating electrons from or to the triphenylamino group covalently bonded to silicon.

Note that the same basic principle also applies to the case of using another organic group or the case of using another metal oxide as the material which is capable of accepting or donating electrons from or to that organic group. Materials may be selected from the combinations described in Embodiment 1 depending on the type of a functional layer manufactured using the composite material.

First, a method for synthesizing alkoxysilane to which a triphenylamino group is attached (N-(4-triethoxysilylphenyl)-N,N-diphenylamine), which is used as a material, is explained. A reaction scheme thereof is represented by Formula (22).

[Formula (22)]

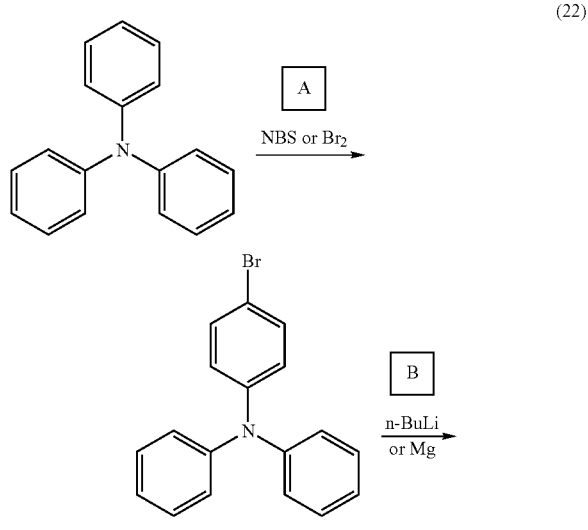

(22)

-continued

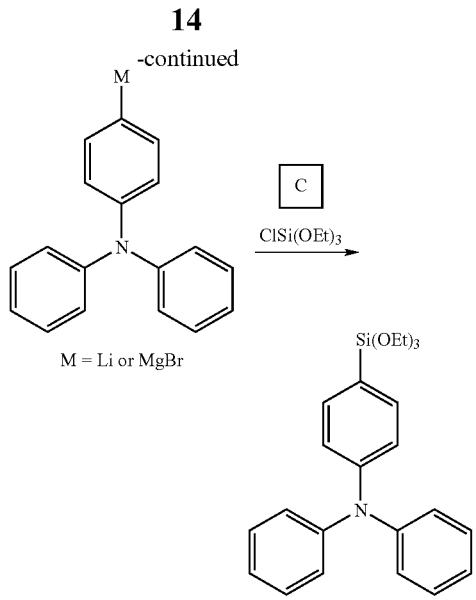

Triphenylamine is treated with NBS (N-bromosuccinimide) or reacted with bromine to obtain N-(4-bromophenyl)-N,N-diphenylamine (A). The obtained N-(4-bromophenyl)-N,N-diphenylamine is reacted with butyllithium or magnesium for metallization (B). The obtained metallized substance is reacted with chlorotriethoxysilane to obtain N-(4-triethoxysilylphenyl)-N,N-diphenylamine (C). Even in the case of using not triphenylamine but another organic group as the organic group which can provide the skeleton composed of siloxane bonds with a hole injecting or transporting property or an electron injecting or transporting property, the synthesis may be performed by a similar method or another known method.

Next, a method for manufacturing a film of the composite material of the invention using the obtained N-(4-triethoxysilylphenyl)-N,N-diphenylamine is explained. A manufacturing scheme is represented by Formulae (23) to (25).

Alkoxysilane having a triphenylamino group (N-(4-triethoxysilylphenyl)N,N-diphenylamine: Compound A) and tetraethoxysilane (Compound B) are dissolved in an ethanol-hydrochloric acid solution at a molar ratio of 1:1 to make Solution 1. With the amount of hydrochloric acid adjusted so that Solution 1 has a pH of 2, alkoxysilane including an organic group (Compound A) and tetraethoxysilane (Compound B) are polycondensed. The polycondensation may be further promoted by heating or maturing. A polymerization degree is set so that precipitation is not caused (Formula (23)).

[Formula (23)]

(23)

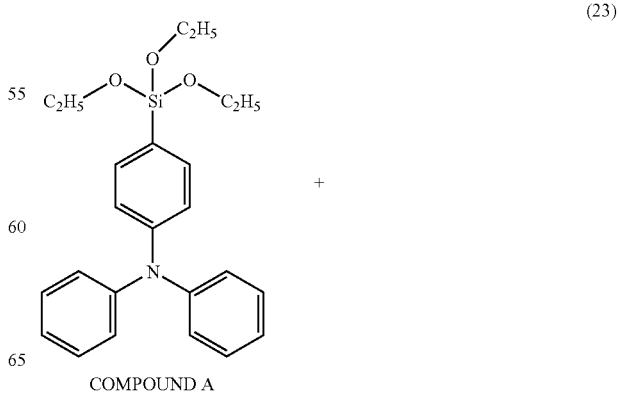

COMPOUND A

-continued

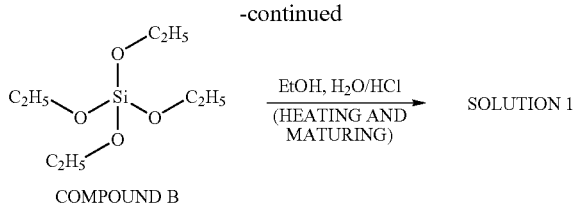

COMPOUND B

Ethyl acetoacetate which is a stabilizer (Compound D) and water are added to an alcohol solution of pentaalkoxy molybdenum (for example, pentaethoxy molybdenum) (Compound C) to make a sol solution, Solution 2. The stabilizer is added as much as one equivalent of molybdenum alkoxide (Compound C) (Formula (24)). Adding the stabilizer can suppress polymerization of molybdenum alkoxide and prevent a polymer from precipitating.

[Formula (24)]

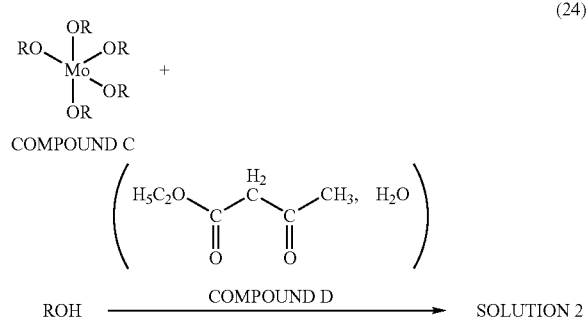

Lastly, Solution 1 is added to Solution 2, and the mixture is stirred, applied to a film-formation surface by a spin coating method, and baked at 150° C. for two hours to form a film of the composite material of the invention (Formula (25)).

[Formula (25)]

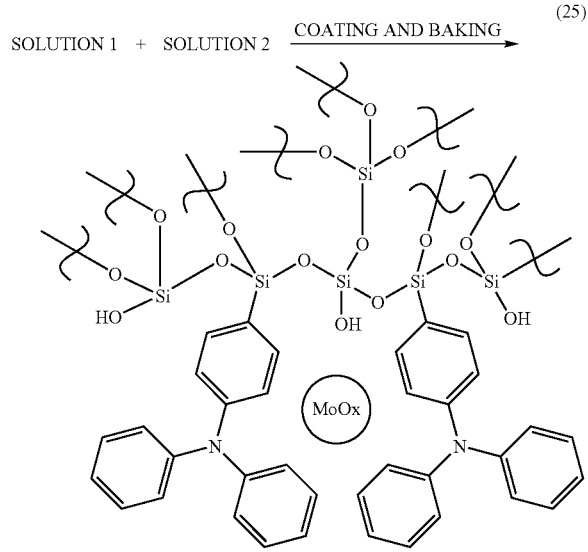

By using the thusly formed composite material of the invention for a hole injecting layer and/or a hole transporting layer of a light emitting element, the light emitting element can be provided with superior heat resistance. In addition, the light emitting element can be driven stably for a long time.

Embodiment 3

In this embodiment, a method for manufacturing the material described in Embodiment 1 by peptization is explained.

First, tetraethoxysilane and/or methyltriethoxysilane and alkoxysilane in which an organic group capable of providing a skeleton composed of siloxane bonds with a hole injecting or transporting property or an electron injecting or transporting property is covalently bonded to silicon in the skeleton are dissolved in an alcohol/hydrochloric acid solution, and stirred with heat to make Solution 1 in the same manner as in Embodiment 2.

Subsequently, an ammonia water solution is dropped into a chloride water solution of metal in metal oxide which is capable of accepting or donating electrons from or to the organic group to form a polynuclear precipitate of hydroxide of the metal. The polynuclear precipitate of hydroxide may be matured at room temperature for approximately over ten hours to twenty four hours. This precipitate is added to a solution containing acetic acid and peptized by reflux to obtain a sol (Solution 3).

The reflux may be performed at appropriate temperature for several hours until metal hydroxide in the solution containing acetic acid becomes colloid to obtain a transparent viscous solution (sol).

When this method using peptization is employed, it is necessary to obtain a polynuclear precipitate of hydroxide. This method cannot be employed for metal which does not form a polynuclear precipitate of hydroxide. This method is preferably used for transition metal oxide or metal oxide of Group 13 since a sol of metal oxide can be obtained without using a stabilizer. Note that acetic acid is evaporated by appropriately adjusting a baking temperature because of its low boiling point of 118° C., and there is little possibility that acetic acid affects characteristics of a functional layer.

Lastly, a composite material in which a material capable of transferring electrons to and from an organic group is added to an organic-inorganic hybrid material where an organic group is covalently bonded to silicon in a skeleton composed of siloxane bonds can be manufactured by adding Solution 3 to Solution 1, and then stirring, applying, and baking the mixture (at 100° C. to 300° C. for several hours). The baking may be performed in the atmosphere, in an inert atmosphere of nitrogen or the like, or in a vacuum. At this time, a ratio of the number of moles of an organic group which can provide a skeleton composed of siloxane bonds with a hole injecting or transporting property or an electron injecting or transporting property to the number of moles of metal in Solution 3 is preferably in the range of 5:1 to 1:5, more preferably, 2:1 to 1:2.

The application can be performed by a wet coating method, for example, a dip coating method, a spin coating method, or a droplet application method such as an inkjet method.

A light emitting element can be provided with superior heat resistance by using the composite material of the invention for a functional layer of the light emitting element. In addition, the light emitting element can be driven stably for a long time.

Note that there is little increase in drive voltage of a light emitting element using the composite material of the invention for a functional layer even when the functional layer is formed to be thick. Consequently, the functional layer between an electrode of a pair of electrodes in the light emitting element, which is formed before the other, and a light emitting layer can be formed to be thick, so that generation of short circuits in the light emitting element due to dust or the like can be reduced. A thickness of 100 nm or more can effectively reduce such defects.

Since the functional layer formed to be thick contains a material which is capable of accepting or donating electrons from or to an organic group covalently bonded to silicon in a siloxane bond, conductivity and a carrier injecting or transporting property are improved. Thus, generation of short circuits in the light emitting element due to dust or the like can be reduced without significantly increasing drive voltage, in other words, without significantly increasing power consumption.

Subsequently, an example of manufacturing a composite material which can be used for a hole injecting layer and/or a hole transporting layer of a light emitting element is specifically given. In this embodiment, explanation is made using, as an example, a triphenylamino group as the organic group covalently bonded to silicon in a skeleton composed of siloxane bonds and aluminum oxide as a material which is capable of accepting or donating electrons from or to the triphenylamino group.

Note that the same basic principle also applies to the case of using another organic group or the case of using another metal oxide as the material which is capable of accepting or donating electrons from or to that organic group. Materials may be selected from the combinations described in Embodiment 1 depending on the type of a functional layer manufactured using the composite material.

A method for synthesizing alkoxysilane to which a triphenylamino group is attached (N-(4-triethoxysilylphenyl)-N, N-diphenylamine) is similar to that described in Embodiment 2. Therefore, explanation thereof is omitted.

A method for manufacturing a film of the composite material of the invention using the obtained N-(4-triethoxysilylphenyl)-N,N-diphenylamine is explained. Note that Solution 1 can be manufactured by a similar method to that described in Embodiment 2; therefore, explanation is omitted.

An ammonia aqueous solution is dropped into a aqueous solution of aluminum chloride to obtain a polynuclear precipitate of aluminum hydroxide (Formula (26)). The obtained polynuclear precipitate of aluminum hydroxide is filtered, rinsed with pure water, added to a solution containing acetic acid, and peptized by reflux at 80° C. for eight hours to form a sol (Formula (27)).

[Formula (26)]

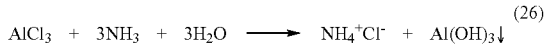

(26)

[Formula (27)]

(27)

Lastly, Solution 1 is added to Solution 3, and the mixture is stirred, applied, and baked. This operation is similar to that described in Embodiment 2; therefore, explanation is omitted.

A light emitting element can be provided with superior heat resistance by using the thus manufactured composite material of the invention for a hole injecting layer and/or a hole transporting layer of the light emitting element. In addition, the light emitting element can be driven stably for a long time.

Embodiment 4

Next, a light emitting element of the invention is explained. The light emitting element of the invention is a light emitting element in which at least one layer of functional layers typified by an electron injecting layer, an electron transporting layer, a hole injecting layer, and a hole transporting layer is formed of a composite material, as described in Embodiments 1 to 3, in which a material capable of transferring electrons to and from an organic group is further added to a hybrid material where an organic group is covalently bonded to silicon in a skeleton composed of siloxane bonds.

The light emitting element of the invention includes at least a light emitting layer containing a light emitting material, which is interposed between a pair of electrodes, in addition to the layer formed of the composite material, and can provide light emission from the light emitting layer by applying voltage.

The light emitting element of the invention having such a structure can be provided with superior heat resistance by forming at least one layer of functional layers typified by an electron injecting layer, an electron transporting layer, a hole injecting layer, and a hole transporting layer with a material having a skeleton composed of siloxane bonds. In addition, the light emitting element can be driven stably for a long time.

Since a material capable of transferring electrons to and from an organic group covalently bonded to silicon in a skeleton composed of siloxane bonds is added to the composite material, conductivity and a carrier injecting or transporting property of the composite material are improved. Accordingly, a functional layer including a skeleton composed of siloxane bonds can be formed without significantly increasing power consumption.

By using a composite material which has a skeleton composed of siloxane bonds and to which a material capable of transferring electrons to and from an organic group covalently bonded to silicon in the skeleton is added, the light emitting element can be provided with superior heat resistance and/or can be driven stably for a long time, and the light emitting element can be formed to consume less power.

Note that the light emitting element of the invention may include a layer which is formed of not the composite material but another material among the above functional layers. Also in this case, heat resistance and durability can be improved by forming the most problematic layer in heat resistance and durability with the composite material.

Note that there is little increase in drive voltage of a light emitting element using the composite material of the invention for the functional layer even when the functional layer is formed to be thick. Consequently, the functional layer between an electrode of a pair of electrodes in the light emitting element, which is formed before the other, and a light emitting layer can be formed to be thick, so that generation of short circuits in the light emitting element due to dust or the like can be reduced. A thickness of 100 nm or more can effectively reduce such defects.

Since the functional layer formed to be thick contains a material which is capable of accepting or donating electrons from or to an organic group covalently bonded to silicon in a siloxane bond, conductivity and a carrier injecting or transporting property are improved. Thus, generation of short circuits in the light emitting element due to dust or the like can be reduced without significantly increasing drive voltage, in other words, without significantly increasing power consumption.

In the light emitting element of the invention, any one of functional layers typified by an electron injecting layer, an electron transporting layer, a hole injecting layer, and a hole transporting layer may be formed of the above composite material, or plural (two or more) layers of them may be formed of the composite material. In addition, all of the functional layers may be formed of the above composite material.

When the light emitting layer is formed using an organic-inorganic hybrid material having a silica matrix, the light emitting element can be provided with further superior heat resistance and driven stably for a longer time. At this time, a sol manufactured by polycondensing alkoxysilane including an organic group emitting light when voltage is applied with tetraethoxysilane, methyltriethoxysilane, or the like is applied to a surface over which the light emitting layer is to be formed and then baked. Accordingly, the light emitting layer can be formed to have a structure in which an organic group emitting light when voltage is applied is covalently bonded to silicon in a skeleton composed of siloxane bonds. Note that in forming a sol, only alkoxysilane including an organic group may be polycondensed. This method for manufacturing a sol is based on the method for making Solution 1 in Embodiment 2 of the invention, and the baking and applying methods are based on those for applying and baking the composite material of the invention. Accordingly, the light emitting layer can be formed with an organic-inorganic hybrid material having a silica matrix.

Figure 11A:
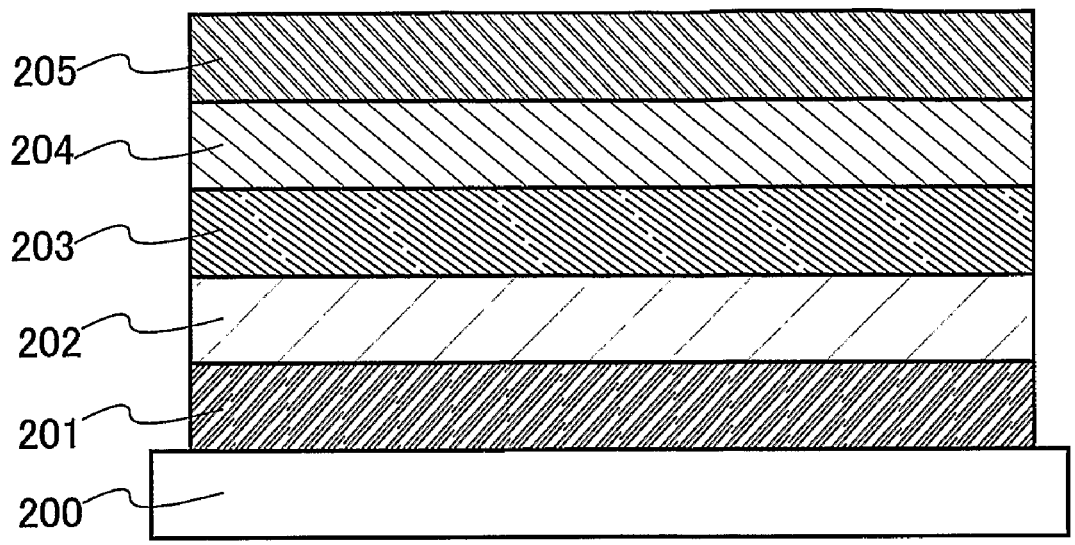
FIGS. 11A and 11B are a structural example of a light emitting element of the present invention.

Subsequently, schematic diagrams of the light emitting element of the invention are shown in FIGS. 11A to 12B. In FIG. 11A, a first electrode 201 is formed over an insulating surface 200 of a substrate or the like, and a hole injecting-transporting layer 202 formed of the composite material of the invention, a light emitting layer 203, an electron injecting-transporting layer 204 formed of the composite material of the invention are sequentially laminated thereover. In addition, a second electrode 205 of the light emitting element is provided thereover. In driving the light emitting element, voltage is applied so that a potential of the first electrode 201 is higher than that of the second electrode 205 (in other words, the first electrode 201 serves as an anode and the second electrode 205 serves as a cathode), thereby obtaining light emission.

The light emitting layer may be formed by an evaporation method, or may be formed with an organic-inorganic hybrid material having a silica matrix and an organic group which emits light by applying voltage as described above.

In this structure, both the hole injecting-transporting layer 202 and the electron injecting-transporting layer 204 are formed of the composite material of the invention. However, either of them may be formed of the composite material of the invention.

The layer which is not formed of the composite material of the invention may be formed of a known material by a known method such as an evaporation method.

The light emitting element as shown in FIG. 11A can be provided with superior heat resistance and driven stably for a long time.

Figure 11B:
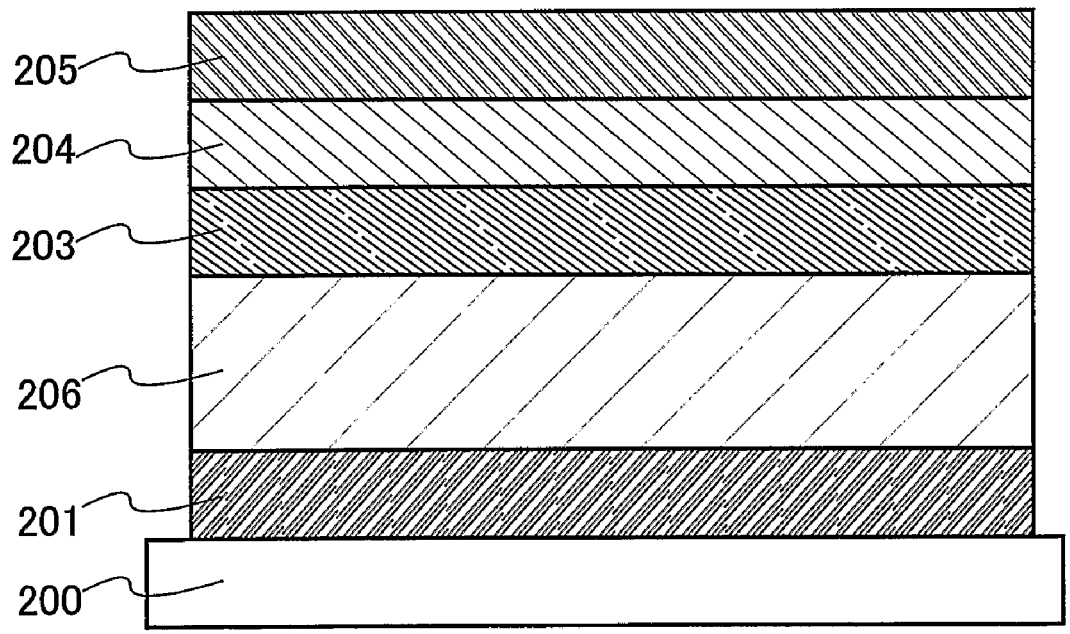

FIG. 11B is a schematic diagram of a light emitting element having a hole injecting-transporting layer 206 which is formed by thickening the hole injecting-transporting layer 202 in FIG. 11A. The other layers are similar to those in FIG. 11A; therefore, explanation is omitted. The light emitting element is formed by laminating extremely thin layers. When the first electrode 201 formed below the thin layers has a projection with small curvature and high height (which is considered to be caused by dust or irregularity therebelow), the thin film cannot cover the projection and results in a break. Consequently, a defect such as a short circuit is caused. On the other hand, when the film is formed to be thick to prevent the defect, there is a disadvantage in that resistance is increased and drive voltage is also increased. However, since the composite material of the invention includes both a carrier transporting organic group in an organic-inorganic hybrid material and a material which is capable of accepting or donating electrons from or to the organic group, it has high conductivity and can prevent resistance from increasing even when formed to be thick. In addition, since the light emitting element shown in FIG. 11B basically has the same structure as that of FIG. 11A, it has superior heat resistance and can be driven stably for a long time. Accordingly, it is found that the light emitting element of the invention having the structure of FIG. 11B has superior heat resistance, can be driven stably for a long time, and has few defects.

Figure 12A:
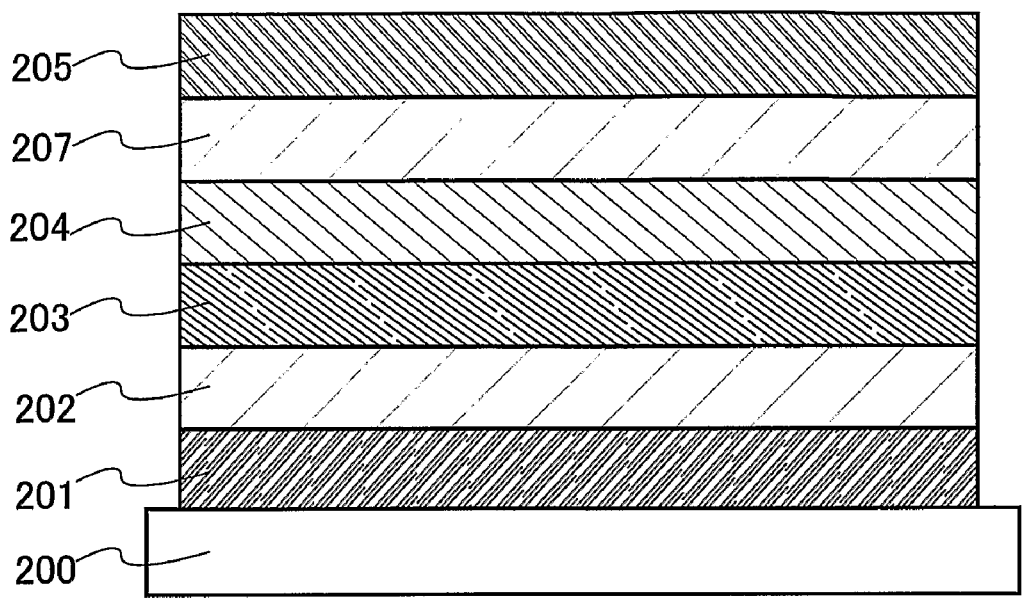
FIGS. 12A and 12B are a structural example of a light emitting element of the invention.

FIG. 12A shows an example of forming a hole injecting-transporting layer 207 with a composite material of the invention between the electron injecting-transporting layer 204 and the second electrode 205 (the electrode serving as a cathode) in FIG. 11A. The hole injecting-transporting layer 207 is formed of a composite material using a group superior in a hole injecting or transporting property as an organic group in an organic-inorganic hybrid material in the composite material and further having a material which is capable of accepting electrons from the organic group, in other words, a material which is supported to be used on an electrode (serving as an anode) side, in other words, on the first electrode 201 side with respect to the light emitting layer 203.

However, when the electron injecting-transporting layer 204 formed of the composite material of the invention and the hole injecting-transporting layer 207 formed of the composite material of the invention are sequentially laminated on an electrode (serving as a cathode) side with respect to the light emitting layer 203, electrons are generated from the electron injecting-transporting layer 204 formed of the composite material of the invention by applying voltage and injected to the light emitting layer. Holes are generated from the hole injecting-transporting layer 207 formed of the composite material of the invention and injected to the electrode serving as a cathode. Accordingly, current flows and light emission can be obtained.

Similarly, the electron injecting-transporting layer can be provided on an electrode (serving as an anode) side, in other words, on the first electrode 201 side with respect to the light emitting layer 203. In other words, the electron injecting-transporting layer formed of the composite material of the invention, the hole injecting-transporting layer formed of the composite material of the invention, and the light emitting layer 203 are sequentially laminated over the electrode serving as an anode. Accordingly, by applying voltage, electrons are injected from the electron injecting-transporting layer to the electrode serving as an anode, and holes are injected from the hole injecting-transporting layer to the light emitting layer 203. Consequently, current flows and light emission can be obtained.

Note that such a structure in which an electron injecting-transporting layer and a hole injecting-transporting layer are laminated may be provided on either or both electrode (serving as an anode and a cathode) sides with respect to the light emitting layer 203.

As to the light emitting element having such a structure, materials of the first electrode 201 and the second electrode 205 can be selected without considering a work function, and a more preferable electrode such as a reflective electrode or a transparent electrode can be selected depending on the structure.

Figure 12B:
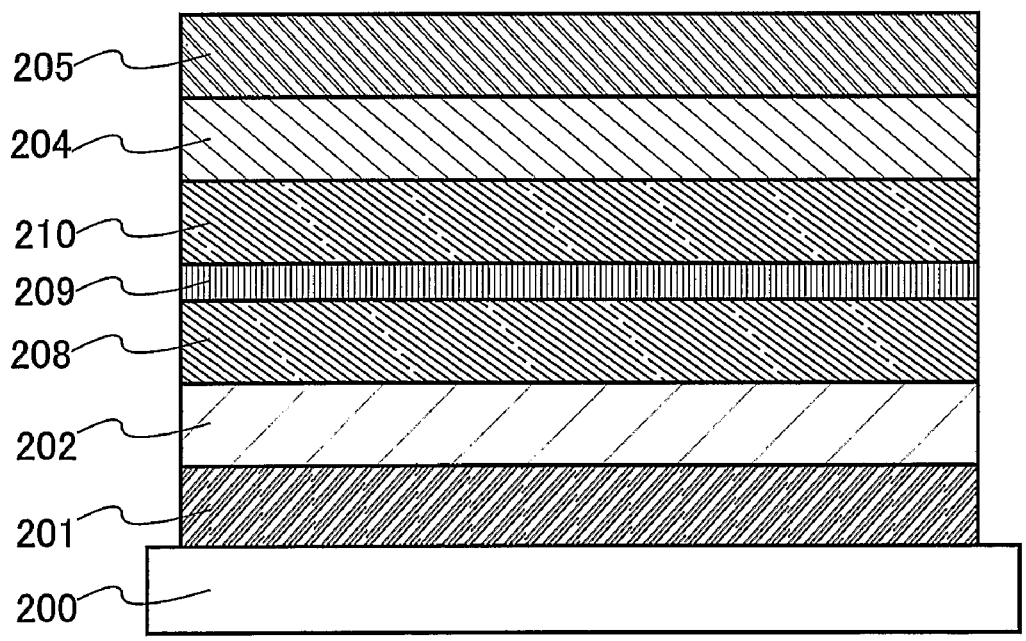

FIG. 12B shows an example of a light emitting element which can emit white light. A first light emitting layer 208, a spacing layer 209, and a second light emitting layer 210 are provided between the hole injecting-transporting layer 202 and the electron injecting-transporting layer 204 in FIG. 11A. White light emission can be obtained by forming the first light emitting layer 208 and the second light emitting layer 210 with materials which exhibit emission colors having a complementary color relationship with each other, for example, red and blue-green.

The spacing layer 209 can be formed with a hole transporting material, an electron transporting material, a bipolar material, a hole blocking material, a carrier generating material, or the like, and needs to transmit light. The spacing layer 209 is provided to prevent that either the first light emitting layer 208 or the second light emitting layer 210 emits intense light due to energy transfer. When such a phenomenon does not occur, the spacing layer 209 may not be provided.

The light emitting element having the structure of FIG. 12B can emit white light, can be provided with superior heat resistance, and can be driven stably for a long time. Such an element can preferably be used for lighting.

Note that this embodiment can be combined with another embodiment as long as it is consistent.

Embodiment 5

In this embodiment, a light emitting device of the invention described in Embodiment 1 or Embodiment 2 is explained describing a manufacturing method thereof with reference to FIGS. 3A to 4C. In this embodiment, an example of manufacturing an active matrix light emitting device is explained. However, the light emitting device of the invention can naturally be applied to a passive matrix light emitting device.

Figure 3A:
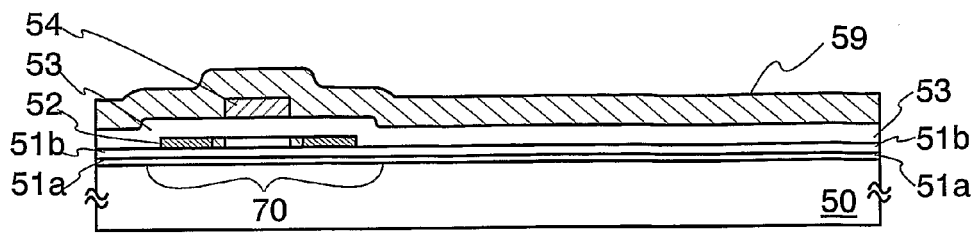
FIGS. 3A to 3E show a step of manufacturing a thin film light emitting element of the invention.

First, a first base insulating layer 51a and a second base insulating layer 51b are formed over a substrate 50, and then, a semiconductor layer is formed over the second base insulating layer 51b (FIG. 3A).

Glass, quartz, or plastic (polyimide, acrylic, polyethyleneterephthalate, polycarbonate, polyacrylate, polyethersulfone, or the like) can be used as a material of the substrate 50. The substrate may be used after polishing by CMP or the like if necessary. A glass substrate is used in this embodiment.

The first base insulating layer 51a and the second base insulating layer 51b are provided to prevent an element exerting an adverse influence on characteristics of the semiconductor layer, such as alkali metal or alkaline earth metal contained in the substrate 50, from diffusing into the semiconductor layer. Silicon oxide, silicon nitride, silicon oxide containing nitrogen, silicon nitride containing oxygen, or the like can be used as a material thereof. In this embodiment, the first base insulating layer 51a is formed of silicon nitride and the second base insulating layer 51b is formed of silicon oxide. The base insulating layer in this embodiment is formed to have a two-layer structure of the first base insulating layer 51a and the second base insulating layer 51b. However, the base insulating layer may be formed to have a single-layer structure or a multilayer structure of two or more layers. The base insulating layer need not necessarily be provided when diffusion of impurities is not so concerned about.

The subsequently formed semiconductor layer is obtained by performing laser crystallization on an amorphous silicon film in this embodiment. An amorphous silicon film is formed with a thickness of 25 nm to 100 nm (preferably, 30 nm to 60 nm) over the second base insulating layer 51b. A known method such as a sputtering method, a low pressure CVD method, or a plasma CVD method can be used as a manufacturing method thereof. Subsequently, the amorphous silicon film is heat-treated at 500° C. for one hour for dehydrogenation.

Then, the amorphous silicon film is crystallized using a laser irradiation apparatus to form a crystalline silicon film. As to the laser crystallization in this embodiment, an excimer laser is used, and an emitted laser beam is processed to have a linear beam spot with an optical system. The amorphous silicon film is irradiated therewith to be a crystalline silicon film, and is used as the semiconductor layer.

As another method for crystallizing an amorphous silicon film, there is a crystallizing method only by heat treatment, a crystallizing method by heat treatment with the use of a catalytic element which promotes crystallization, or the like. Nickel, iron, palladium, tin, lead, cobalt, platinum, copper, gold, or the like can be used as the element which promotes crystallization. By using the element, crystallization can be performed at a lower temperature in a shorter time, compared to the case of performing crystallization only by heat treatment. Therefore, a glass substrate or the like is less damaged. In the case of performing crystallization only by heat treatment, a highly heat resistant quartz substrate or the like may be used as the substrate 50.

Subsequently, addition of a very small amount of impurities, so-called channel doping, is performed on the semiconductor layer to control a threshold value, if necessary. The semiconductor layer is doped with an n-type or p-type impurity (phosphorus, boron, or the like) by an ion doping method or the like to obtain a required threshold value.

Thereafter, the semiconductor layer is formed into a predetermined shape as shown in FIG. 3A, thereby obtaining an island-shape semiconductor layer 52. A photoresist is applied to the semiconductor layer, exposed to light, and baked to form a resist mask over the semiconductor layer. Etching is then performed using the mask. Thus, the formation of the island-shape semiconductor layer is performed.

A gate insulating layer 53 is formed to cover the semiconductor layer 52. The gate insulating layer 53 is formed of an insulating layer containing silicon with a thickness of 40 nm to 150 nm by a plasma CVD method or a sputtering method. In this embodiment, the gate insulating layer 53 is formed using silicon oxide.

A gate electrode 54 is formed over the gate insulating layer 53. The gate electrode 54 may be formed using an element selected from tantalum, tungsten, titanium, molybdenum, aluminum, copper, chromium, and niobium, or an alloy material or a compound material which mainly contains the element. A semiconductor film typified by a polycrystalline silicon film doped with an impurity element such as phosphorus may be used. Alternatively, an AgPdCu alloy may be used.

The gate electrode 54 is formed to be a single layer in this embodiment; however, it may be formed to have a laminated structure of two or more layers (for example, a laminated structure of a tungsten layer as a lower layer and a molybdenum layer as an upper layer). The above-mentioned material may be used even in the case of forming a gate electrode having a laminated structure. A combination thereof may also be appropriately selected. The gate electrode 54 is processed by etching using a mask of a photoresist.

A highly concentrated impurity is added to the semiconductor layer 52 with the use of the gate electrode 54 as a mask. According to this step, a thin film transistor 70 including the semiconductor layer 52, the gate insulating layer 53, and the gate electrode 54 is formed.

A process of manufacturing a thin film transistor is not particularly limited, and it may be appropriately changed so that a transistor having a desired structure can be formed.

A top gate type thin film transistor using a crystalline silicon film which is crystallized by employing laser crystallization is used in this embodiment; however, a bottom gate type thin film transistor using an amorphous semiconductor film can be used for a pixel portion. Silicon germanium as well as silicon can be used for an amorphous semiconductor. In the case of using silicon germanium, the concentration of germanium is preferably approximately 0.01 atomic % to 4.5 atomic %.

A microcrystalline semiconductor (semi-amorphous semiconductor) film, in which a crystal grain of 0.5 nm to 20 nm can be observed within an amorphous semiconductor, may be used. A microcrystalline state in which a crystal grain of 0.5 nm to 20 nm can be observed is also referred to as a microcrystal (μc).

Semi-amorphous silicon (also referred to as SAS) that is a semi-amorphous semiconductor can be obtained by performing glow discharge decomposition on a silicide gas. $SiH_4$ is used as a typical silicide gas. In addition, $Si_2H_6$, $SiH_2Cl_2$, $SiHCl_3$, $SiCl_4$, $SiF_4$, or the like can also be used as the silicon source gas. The silicon source gas may be diluted with hydrogen, or hydrogen and one or more rare gas elements of helium, argon, krypton, and neon, thereby making formation of the SAS easy. At this time, it is preferable to dilute the silicon source gas so that a dilution ratio ranges from 10 times to 1000 times. Reaction production of a film by glow discharge decomposition may be performed with pressures in the range of 0.1 Pa to 133 Pa. High-frequency powers of 1 MHz to 120 MHz, preferably, 13 MHz to 60 MHz may be supplied to form a glow discharge. A substrate heating temperature is preferably 300° C. or less, and a suitable substrate heating temperature is in the range of 100° C. to 250° C.

In the thus formed SAS, a Raman spectrum is shifted to a lower wavenumber side than 520 $cm^{-1}$. A diffraction peak of (111) or (220) to be caused by a crystal lattice of silicon is observed in X-ray diffraction. The SAS contains hydrogen or halogen of at least 1 atomic % or more to terminate dangling bonds. It is desirable that an atmospheric constituent impurity such as oxygen, nitrogen, or carbon is $1\times10^{20}$ $cm^{-1}$ or less as an impurity element in the film; specifically, an oxygen concentration is $5\times10^{19}/cm^3$ or less, preferably $1\times10^{19}/cm^3$ or less. When the SAS is processed into a TFT, mobility thereof is as follows: $\mu=1$ $cm^2/Vsec$ to 10 $cm^2/Vsec$.

The SAS may be further crystallized with a laser.

Subsequently, an insulating film (hydrogenation film) 59 is formed of silicon nitride to cover the gate electrode 54 and the gate insulating layer 53. After the insulating film (hydrogenation film) 59 is formed, it is then heated at 480° C. for approximately one hour to activate the impurity element and hydrogenate the semiconductor layer 52.

Figure 3B:
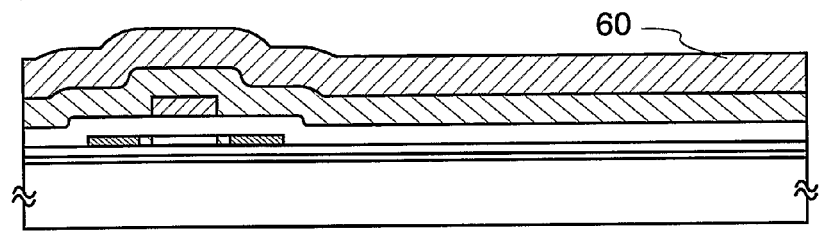

Then, a first interlayer insulating layer 60 is formed to cover the insulating film (hydrogenation film) 59. The first interlayer insulating layer 60 may be formed of silicon oxide, acrylic, polyimide, siloxane, a low-k material, or the like. In this embodiment, a silicon oxide film is formed as the first interlayer insulating layer 60 (FIG. 3B).

Figure 3C:
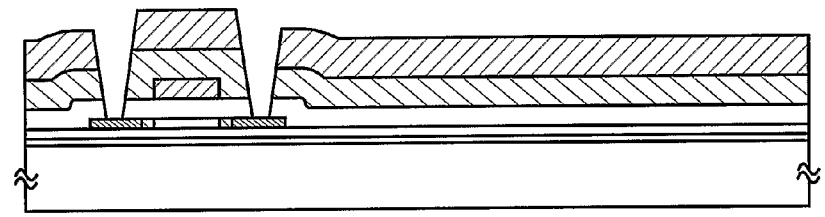

Next, a contact hole reaching the semiconductor layer 52 is formed. The contact hole can be formed by performing etching to expose the semiconductor layer 52. It can be formed by either wet etching or dry etching. Note that, depending on conditions, etching may be performed at a time or plural times. When etching is performed plural times, both wet etching and dry etching may be used (FIG. 3C).

Figure 3D:
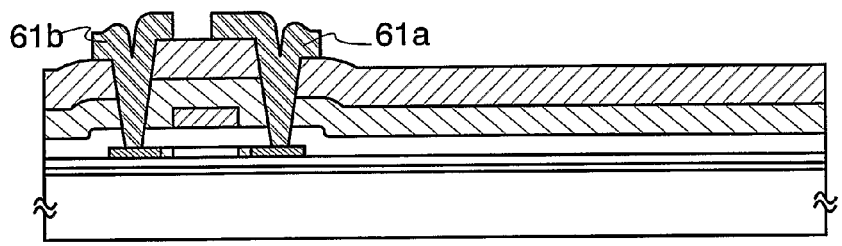

A conductive layer is formed to cover the contact hole and the first interlayer insulating layer 60. The conductive layer is processed into a desired shape to form a connecting portion 61a, a wiring 61b, or the like. The wiring may be a single layer of aluminum, copper, an alloy of aluminum, carbon, and nickel, an alloy of aluminum, carbon, and molybdenum, or the like. The wiring may have a sequentially laminated structure of: molybdenum, aluminum, and molybdenum; titanium, aluminum, and titanium; titanium, titanium nitride, aluminum, and titanium; or the like (FIG. 3D).

Figure 3E:
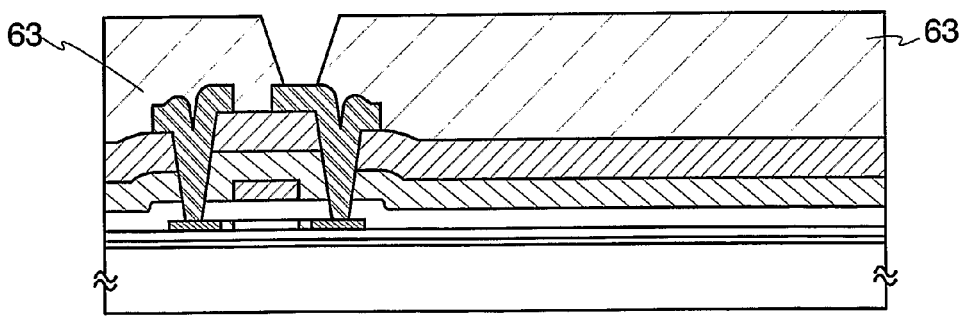

Thereafter, a second interlayer insulating layer 63 is formed to cover the connecting portion 61a, the wiring 61b, and the first interlayer insulating layer 60. The second interlayer insulating layer 63 can preferably be formed with an application film of acrylic, polyimide, siloxane, or the like having a self-planarizing property. In this embodiment, siloxane is used for the second interlayer insulating layer 63 (FIG. 3E).

An insulating layer may be formed of silicone nitride or the like over the second interlayer insulating layer 63. This layer is formed to prevent the second interlayer insulating layer 63 from being etched more than necessary in etching a pixel electrode to be formed later. Therefore, it may not be provided particular when etching rates of the pixel electrode and the second interlayer insulating layer are high. Subsequently, a contact hole penetrating the second interlayer insulating layer 63 is formed to reach the connecting portion 61a.

A light-transmitting conductive layer is formed to cover the contact hole and the second interlayer insulating layer 63 (or the insulating layer) and is then processed to form a first electrode 64 of a thin-film light emitting element. Here, the first electrode 64 is electrically in contact with the connecting portion 61a.

The first electrode 64 can be formed with a conductive film of conductive metal such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti); an alloy thereof; nitride of a metal material (for example, TiN); metal oxide such as indium tin oxide (ITO), silicon-containing ITO (ITSO), or IZO in which zinc oxide (ZnO) is mixed into indium oxide; or the like.

Figure 4A:
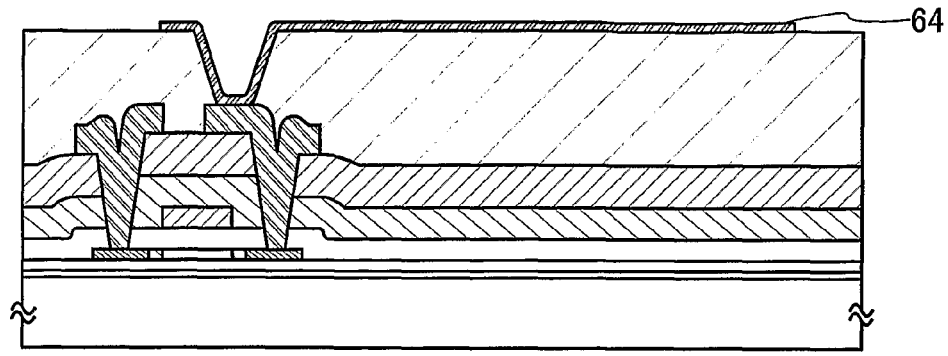
FIGS. 4A to 4C show a step of manufacturing a thin film light emitting element of the invention.

In addition, an electrode through which light is extracted may be formed with a transparent conductive film, and an extremely thin film of metal such as Al or Ag as well as metal oxide such as ITO, ITSO, or IZO is used. When light is extracted through a second electrode, the first electrode can be formed of a highly reflective material (such as Al or Ag). In this embodiment, ITSO is used for the first electrode 64 (FIG. 4A).

Figure 4B:
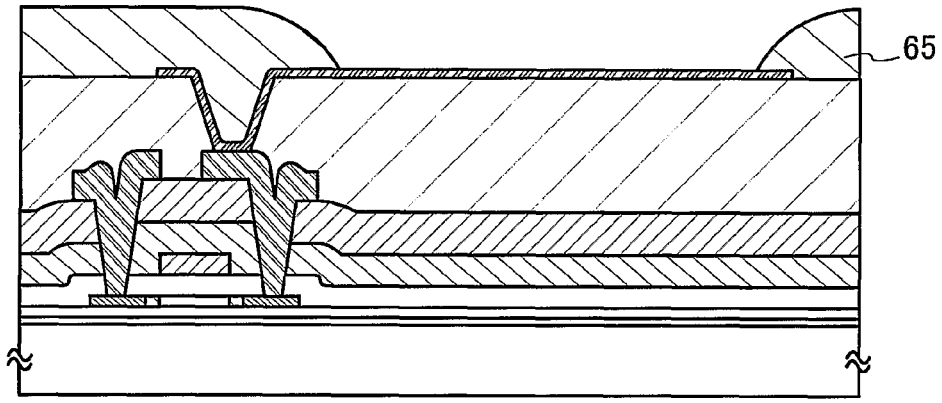
Figure 4C:
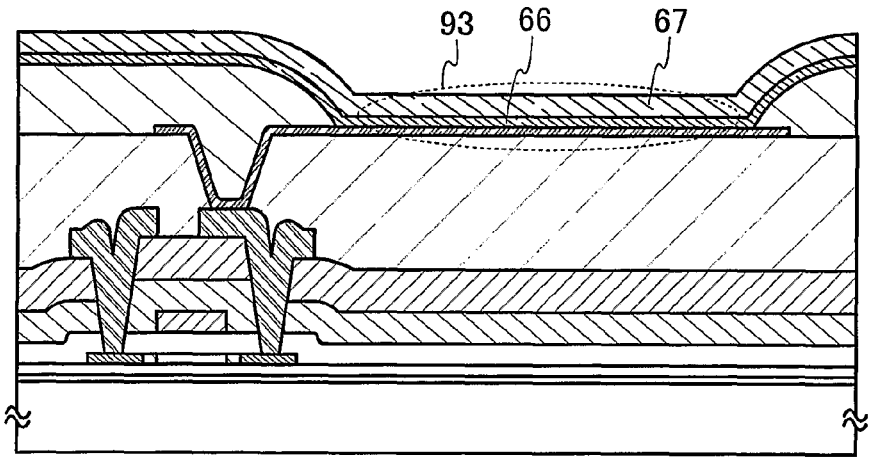

Subsequently, an insulating layer formed of an organic material or an inorganic material is formed to cover the second interlayer insulating layer 63 (or the insulating layer) and the first electrode 64. The insulating layer is processed so as to partially expose the first electrode 64 to form a partition wall 65. The partition wall 65 is preferably formed of a photosensitive organic material (acrylic, polyimide, or the like), but it may be formed of a non-photosensitive organic material or an inorganic material. The partition wall 65 may be blacked by dispersing black colorant or dye such as titanium black or carbon nitride into the material of the partition wall 65 and may be used like black matrix. An edge of the partition wall 65, facing an opening, preferably has curvature and a tapered shape in which the curvature continuously changes (FIG. 4B).

Subsequently, a hole injecting layer is formed of a composite material which has a silica matrix to which a triphenylamino group is attached and molybdenum oxide to cover the exposed portion of the first electrode 64 which is not covered with the partition wall 65. This hole injecting layer may be formed by the method described in Embodiment 2, and an inkjet method is preferably used for application. Then, a light emitting layer is formed using the organic-inorganic material having a silica matrix described in Embodiment 4. Application thereof is similarly performed by an inkjet method. Subsequently, an electron injecting layer is formed of a composite material which has a silica matrix to which a pyridine group is attached and lithium oxide. This electron injecting layer may also be formed by the method described in Embodiment 2, and an inkjet method is preferably used for application.

Thereafter, a second electrode 67 is formed to cover a light emitting laminated body 66. Accordingly, a light emitting element 93 having a laminated body including the light emitting layer, which is interposed between the first electrode 64 and the second electrode 67, can be manufactured. Light emission can be obtained by applying higher voltage to the first electrode than to the second electrode. The second electrode 67 can be formed using a similar electrode material to that of the first electrode. In this embodiment, aluminum is used for the second electrode 67.

A light emitting element having the above-described structure has superior heat resistance and durability because of using a composite material including a skeleton composed of siloxane bonds. Since a composite material, to which a material capable of transferring electron to and from an organic group providing the skeleton with a hole or electron injecting or transporting property is added, is used, the hole or electron injecting or transporting property is improved and conductivity is also improved in the light emitting element.

By forming a functional layer over the first electrode to have a thickness of 100 nm or more using a composite material in which a hole or electron injecting or transporting property and conductivity are improved, generation of defects due to dust or the like over the first electrode can be reduced without significantly increasing drive voltage.

In this embodiment, the hole transporting layer is formed over the first electrode. However, an electron transporting layer may be provided over the first electrode to have a laminated structure in reverse order. In this case, light emission can be obtained by applying lower voltage to the first electrode than to the second electrode.

A silicon oxide film containing nitrogen is formed as a passivation film by a plasma CVD method. In the case of using the silicon oxide film containing nitrogen, a silicon oxynitride film formed from $SiH_4$, $N_2O$, and $NH_3$, a silicon oxynitride film formed from $SiH_4$ and $N_2O$, or a silicon oxynitride film formed from a gas in which $SiH_4$ and $N_2O$ are diluted with Ar may be formed by a plasma CVD method.

A silicon oxynitride hydride film formed from $SiH_4$, $N_2O$, and $H_2$ may be used as the passivation film. Naturally, the structure of the passivation film is not limited to a single layer structure. The passivation film may have a single-layer structure or laminated structure of another insulating film containing silicon. In addition, a multilayer film of a carbon nitride film and a silicon nitride film, a multilayer film of styrene polymer, a silicon nitride film, or a diamond like carbon film may be substituted for the silicon oxide film containing nitrogen.

Then, a display portion is sealed to protect the light emitting element from a material such as water which promotes deterioration. In the case of using an opposing substrate for sealing, the opposing substrate is attached by using an insulating sealant so that an external connection portion is exposed. A space between the opposing substrate and an element substrate may be filled with a dry inert gas such as nitrogen, or the opposing substrate may be attached by entirely applying a sealant to the pixel portion. It is preferable to use an ultraviolet curing resin or the like as the sealant. The sealant may be mixed with a drying agent or particles for keeping a gap between the electrodes constant. Then, the light emitting device is completed by attaching a flexible wiring board to the external connection portion.

A structural example of a light emitting device manufactured as described above is explained with reference to FIGS. 5A and 5B. Note that a portion having a similar function, even if it has a different shape, may be denoted by the same reference numeral, and explanation thereof may be omitted. In this embodiment, a thin film transistor 70 having an LDD structure is connected to a light emitting element 93 through a connecting portion 61a.

Figure 5A:
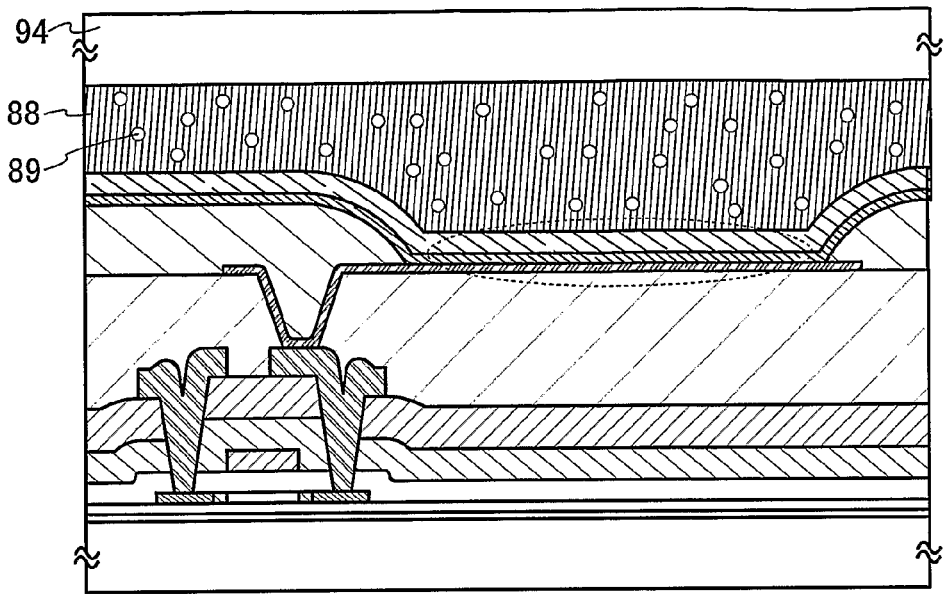
FIGS. 5A and 5B show an example of a structure of a display device.

FIG. 5A shows a structure in which a first electrode 64 is formed of a light transmitting conductive film and light emitted from a light emitting laminated body 66 is extracted to a substrate 50 side. Note that reference numeral 94 denotes an opposing substrate and is fixed to the substrate 50 with the use of a sealant or the like after the light emitting element 93 is formed. A space between the opposing substrate 94 and the element is filled with a light transmitting resin 88 or the like, and sealing is performed. Accordingly, the deterioration of the light emitting element 93 due to moisture can be prevented. The resin 88 is preferably hygroscopic. When a highly light-transmitting drying agent 89 is dispersed in the resin 88, an influence of the moisture can be further reduced. Therefore, it is a more preferable mode.

Figure 5B:
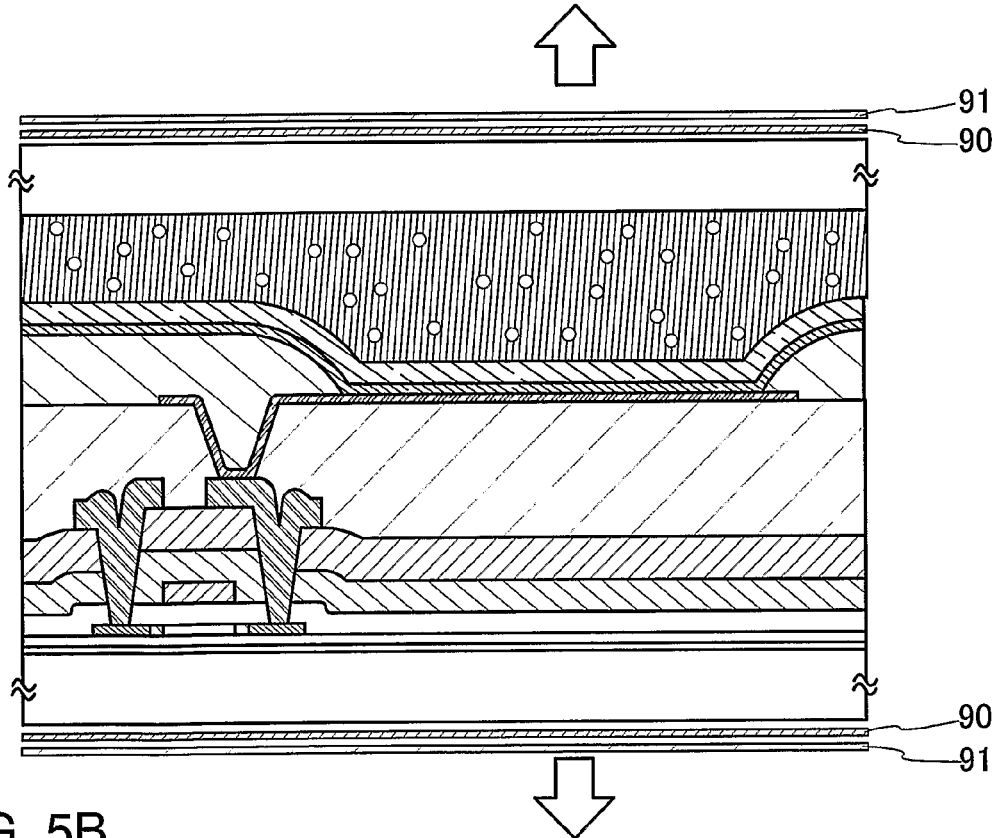

FIG. 5B shows a structure in which both a first electrode 64 and a second electrode 67 are formed of a light transmitting conductive film and light can be extracted to both a substrate 50 and an opposing substrate 94 sides. In this structure, a screen can be prevented from being transparent by providing a polarizing plate 90 outside the substrate 50 and the opposing substrate 94, and visibility is increased. A protective film 91 is preferably provided outside the polarizing plate 90.

Note that either an analog video signal or a digital video signal may be used for a light emitting device of the invention having a display function. In the case of using a digital video signal, the video signal can be divided into a video signal using voltage and a video signal using current. A video signal, inputted to a pixel when a light emitting element emits light, includes a constant voltage video signal and a constant current video signal. The constant voltage video signal includes a signal in which voltage applied to a light emitting element is constant and a signal in which current applied to a light emitting element is constant. The constant current video signal includes a signal in which voltage applied to a light emitting element is constant and a signal in which current applied to a light emitting element is constant. Drive with the signal in which voltage applied to a light emitting element is constant is constant voltage drive, and that with the signal in which current applied to a light emitting element is constant is constant current drive. By constant current drive, constant current is applied to a light emitting element regardless of a change in resistance of the light emitting element. For a light emitting display device of the invention and a driving method thereof, any of the above-described driving methods may be employed.

As to the light emitting device of the invention formed by a method as in this embodiment, there is no need to consider a work function in selecting a material of the second electrode 67 of a light emitting element included in the light emitting device. In addition, the range of material choices is expanded in selecting a material for forming the second electrode 67. Accordingly, a more suitable material for a structure of the light emitting element can be used.

This embodiment can be combined with an appropriate structure of Embodiments 1 to 4.

Embodiment 6

Figure 6A:
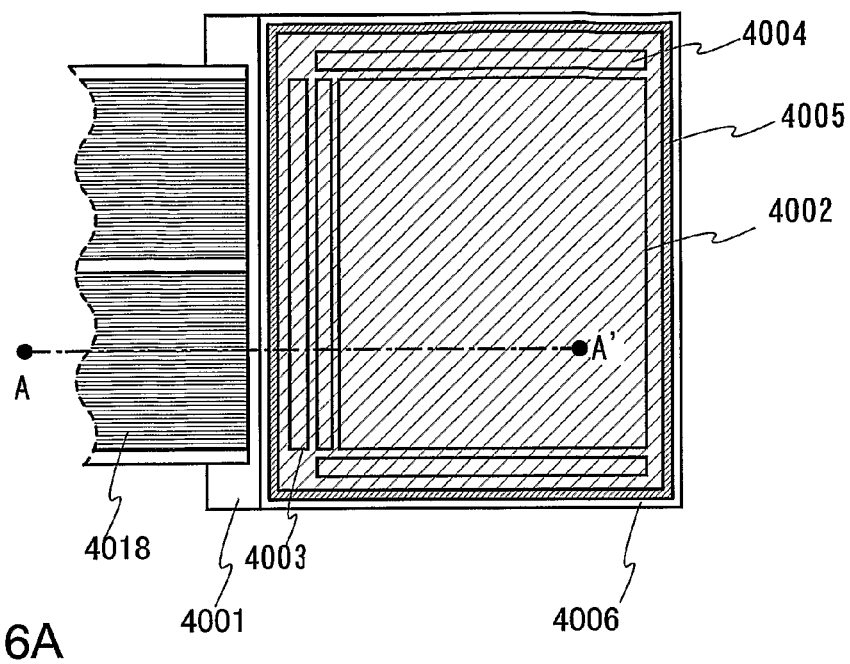
FIGS. 6A and 6B are a top view and a cross-sectional view of a light emitting device of the invention.
Figure 6B:
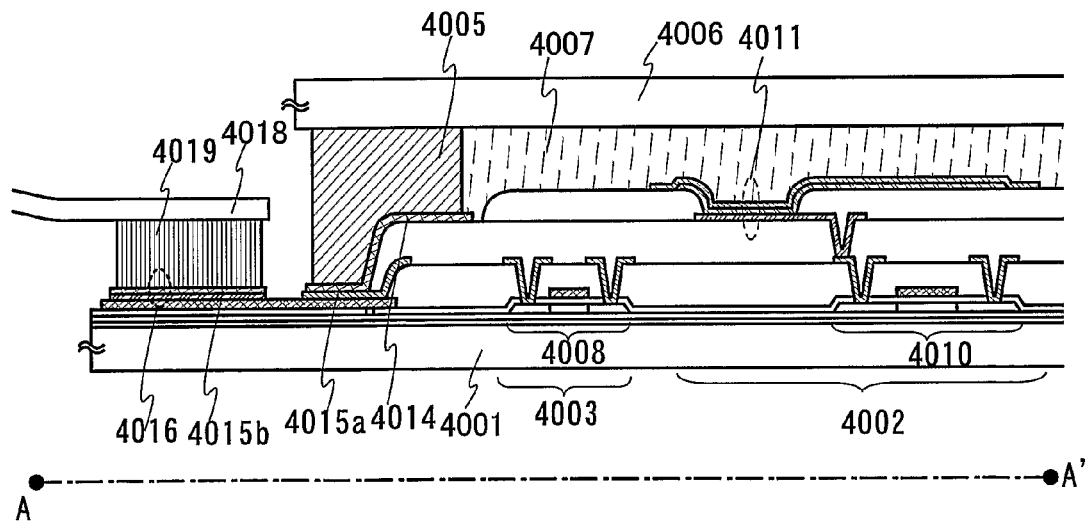

The appearance of a panel of a light emitting device which corresponds to one mode of the invention is explained in this embodiment with reference to FIGS. 6A and 6B. FIG. 6A is a top view of a panel in which a transistor and a light emitting element formed over a substrate are sealed with a sealant formed between the substrate and an opposing substrate 4006. FIG. 6B corresponds to a cross-sectional view of FIG. 6A. The light emitting element mounted on this panel has such a structure as described in Embodiment 4.

A sealant 4005 is provided to surround a pixel portion 4002, a signal line driver circuit 4003, and a scanning line driver circuit 4004 which are provided over a substrate 4001. An opposing substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 are sealed with the substrate 4001, the sealant 4005, and the opposing substrate 4006, together with a filler 4007.

The pixel portion 4002, the signal line driver circuit 4003, and the scanning line driver circuit 4004 which are provided over the substrate 4001 have a plurality of thin film transistors. FIG. 6B shows a thin film transistor 4008 included in the signal line driver circuit 4003 and a thin film transistor 4010 included in the pixel portion 4002.

A light emitting element 4011 is electrically connected to the thin film transistor 4010.

A lead wiring 4014 corresponds to a wiring for supplying signals or power voltage to the pixel portion 4002, the signal line driver circuit 4003, and the scanning line driver circuit 4004. The lead wiring 4014 is connected to a connection terminal 4016 through a lead wiring 4015a and a lead wiring 4015b. The connection terminal 4016 is electrically connected to a terminal included in a flexible printed circuit (FPC) 4018 through an anisotropic conductive film 4019.

An ultraviolet curing resin or a thermosetting resin as well as an inert gas such as nitrogen or argon can be used as the filler 4007. Polyvinyl chloride, acrylic, polyimide, an epoxy resin, a silicone resin, polyvinyl butyral, or ethylene vinylene acetate can be used.

A light emitting device of the invention includes, in its category, a panel provided with a pixel portion having a light emitting element and a module in which an IC is mounted on the panel.

A panel and a module having the structure as in this embodiment have superior heat resistance and durability because of using a composite material including a skeleton composed of siloxane bonds for the light emitting element. Since a composite material, to which a material capable of transferring electrons to and from an organic group providing the skeleton with an electron or hole injecting or transporting property is added, is used, a hole or electron injecting or transporting property is improved and conductivity is also improved in the panel and the module.

By forming a functional layer over the first electrode to have a thickness of 100 nm or more using a composite material in which a hole or electron injecting or transporting property and conductivity are improved, generation of defects due to dust or the like over the first electrode can be reduced without significantly increasing drive voltage.

This embodiment can be combined with an appropriate structure of Embodiments 1 to 5.

Embodiment 7

Examples of electronic devices of the invention mounted with a module, one example of which is described in Embodiment 6, can be given as follows: a video camera, a digital camera, a goggle type display (a head mounted display), a navigation system, an audio reproducing device (a car audio component, or the like), a computer, a game machine, a portable information terminal (a mobile computer, a cellular phone, a portable game machine, an electronic book, or the like), an image reproducing device including a recording medium (specifically, a device capable of processing data in a recording medium such as a Digital Versatile Disc (DVD) and having a display that can display the image of the data), and the like. Practical examples of these electronic devices are shown in FIGS. 7A to 7E.

Figure 7A:
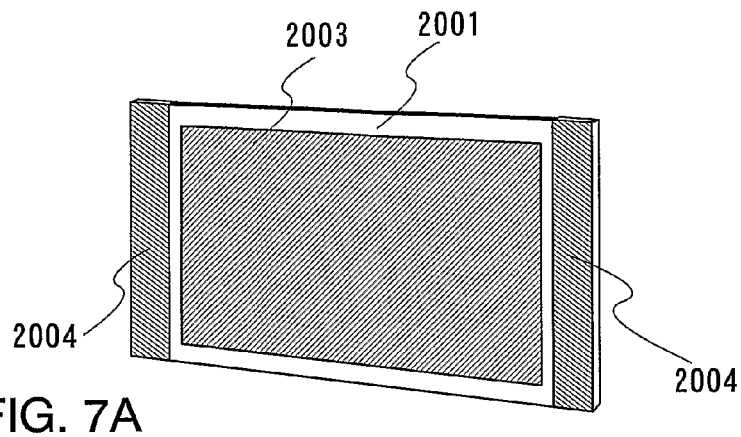
FIGS. 7A to 7E shows examples of electronic devices to which the invention can be applied.

FIG. 7A shows a light emitting display device, which corresponds to a TV set, a monitor of a personal computer, or the like. The light emitting display device includes a chassis 2001, a display portion 2003, a loudspeaker portion 2004, or the like. The light emitting display device of the invention is highly reliable, because the display portion 2003 thereof has superior heat resistance and can be driven stably for a long time. A pixel portion is preferably provided with a polarizing plate or a circularly polarizing plate to enhance contrast. For example, a quarter-wave plate, a half-wave plate, and a polarizing plate may be sequentially formed over a sealing substrate. Further, an anti-reflective film may be provided over the polarizing plate.

Figures 7B, 7C:
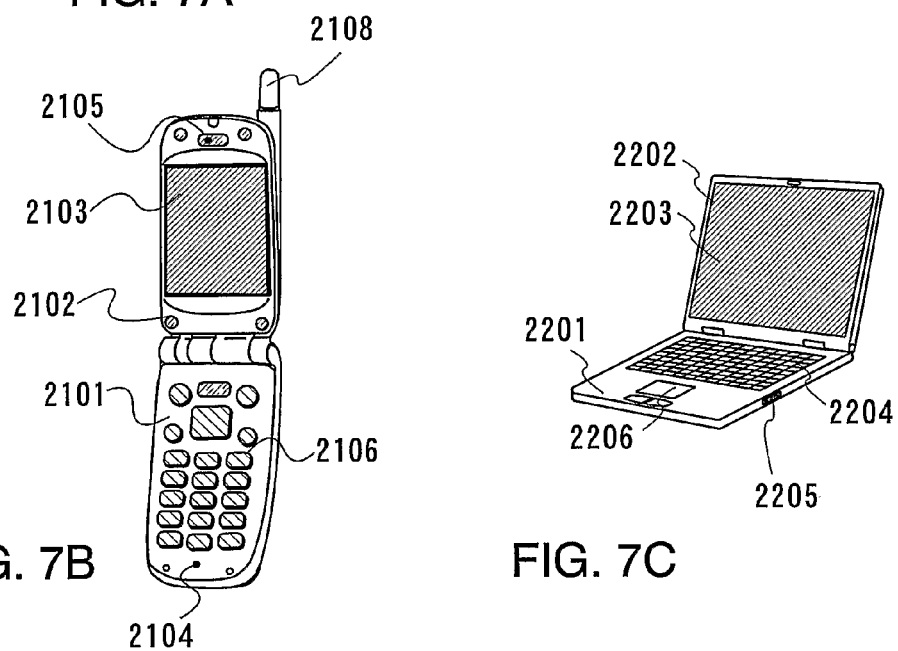

FIG. 7B shows a cellular phone, which includes a main body 2101, a chassis 2102, a display portion 2103, an audio input portion 2104, an audio output portion 2105, an operation key 2106, an antenna 2108, or the like. The cellular phone of the invention is highly reliable, because the display portion 2103 thereof has superior heat resistance and can be driven stably for a long time.

FIG. 7C shows a computer, which includes a main body 2201, a chassis 2202, a display portion 2203, a keyboard 2204, an external connection port 2205, a pointing mouse 2206, or the like. The computer of the invention is highly reliable, because the display portion 2203 thereof has superior heat resistance and can be driven stably for a long time. Although the notebook computer is shown in FIG. 7C as an example, the invention can be applied to a desktop computer or the like.

Figure 7D:
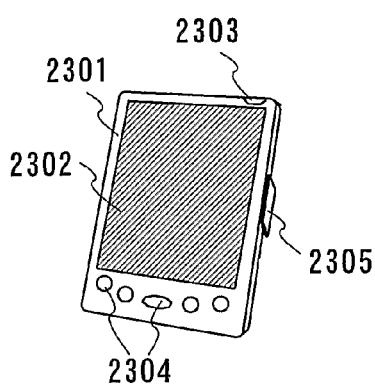

FIG. 7D shows a mobile computer, which includes a main body 2301, a display portion 2302, a switch 2303, an operation key 2304, an infrared port 2305, or the like. The mobile computer of the invention is highly reliable, because the display portion 2302 thereof has superior heat resistance and can be driven stably for a long time.

Figure 7E:
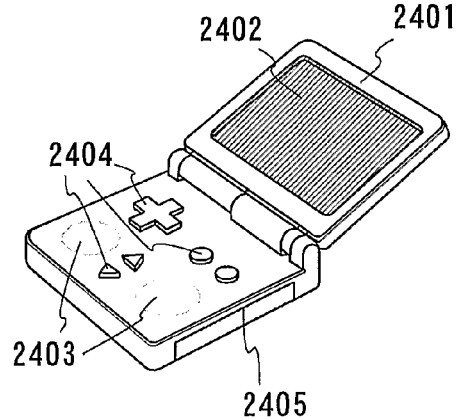

FIG. 7E shows a portable game machine, which includes a chassis 2401, a display portion 2402, a loudspeaker portion 2403, an operation key 2404, a recording medium insertion portion 2405, or the like. The portable game machine of the invention is highly reliable, because the display portion 2402 thereof has superior heat resistance and can be driven stably for a long time.

As described above, the applicable range of the present invention is so wide that the invention can be applied to electronic devices of various fields.

Embodiment 8

Figure 8A:
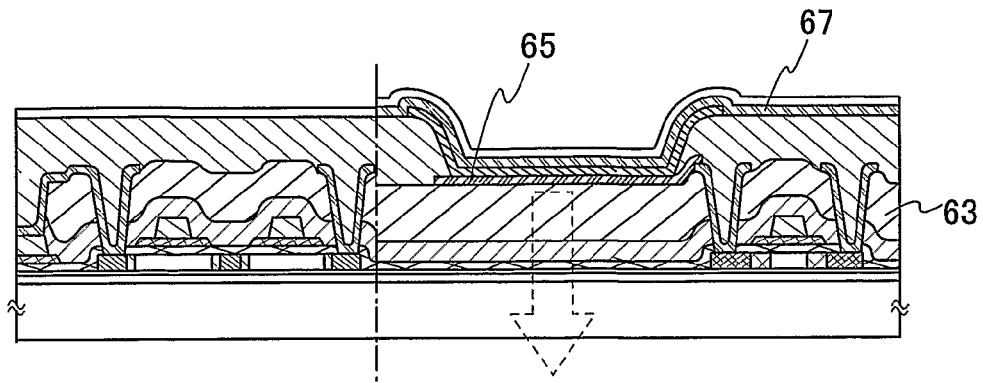
FIGS. 8A to 8C show an example of a structure of a display device.
Figure 8B:
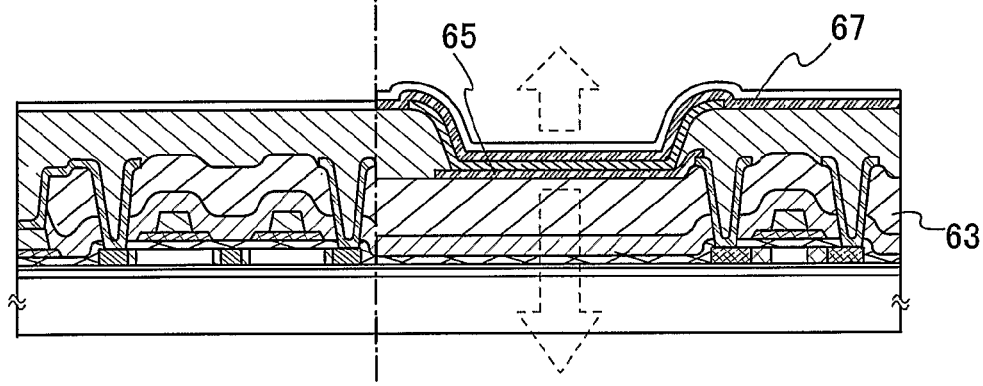
Figure 8C:
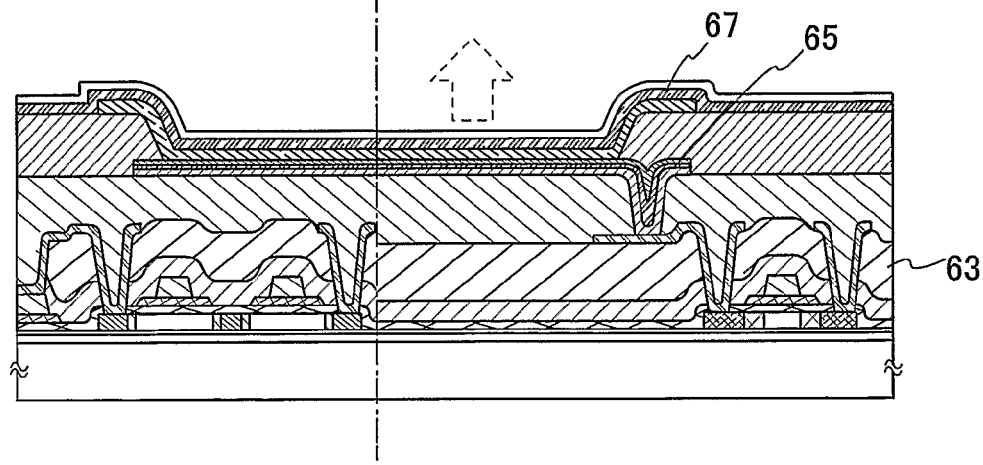

FIGS. 8A to 8C show examples of bottom emission, dual emission, and top emission. The structure whose manufacturing step is described in Embodiment 2 corresponds to a structure in FIG. 8C. Each of FIGS. 8A and 8B shows a structure in which a first interlayer insulating layer 63 in FIG. 8C is formed using a self-planarizing material and a wiring connected to a thin film transistor 70 and a first electrode 64 of a light emitting element are formed over the same interlayer insulating layer. FIG. 8A shows a bottom emission type light emitting display device in which only a first electrode 64 of the light emitting element is formed of a light transmitting material and light is emitted toward a lower portion of the light emitting device. FIG. 8B shows a dual emission type light emitting display device in which a second electrode 67 is formed of a light transmitting material such as ITO, ITSO, or IZO and light can be extracted from both sides. Note that aluminum, silver, or the like does not transmit light when formed thickly, but it transmits light when thinned. Therefore, dual emission can be achieved by forming the second electrode 67 with such a thin film of aluminum or silver as to transmit light.

Embodiment 9

A pixel circuit and a protective circuit which are included in the panel or module described in Embodiment 6, and operation thereof are explained in this embodiment. Note that the cross-sectional views shown in FIGS. 3A to 4C correspond to cross-sectional views of a driver TFT 1403 and a light emitting element 1405.

Figure 9A:
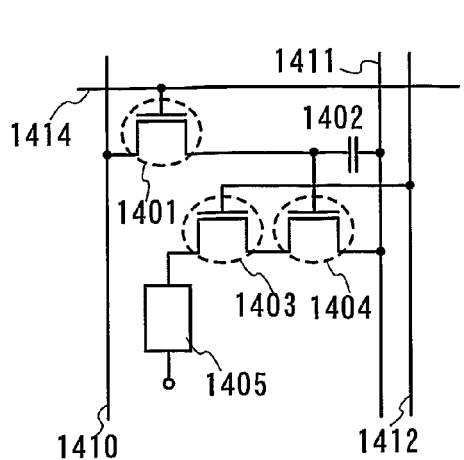
FIGS. 9A to 9F show an example of a pixel circuit in a display device.

In a pixel shown in FIG. 9A, a signal line 1410 and power supply lines 1411 and 1412 are arranged in a column direction and a scanning line 1414 is arranged in a row direction. In addition, the pixel includes a switching TFT 1401, a driver TFT 1403, a current control TFT 1404, a capacitor element 1402, and a light emitting element 1405.

Figure 9B:
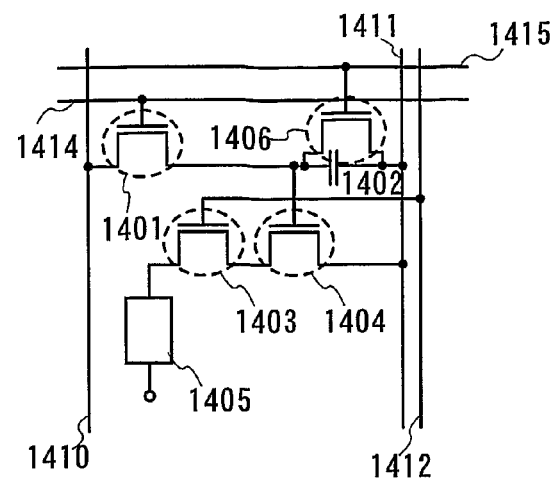
Figure 9C:
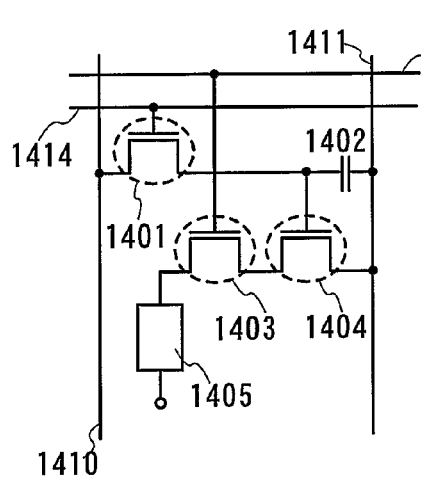
Figure 9D:
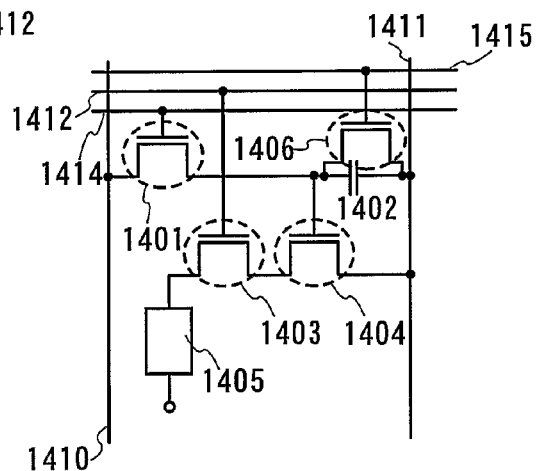

A pixel shown in FIG. 9C is different in that a gate electrode of a driver TFT 1403 is connected to a power supply line 1412 arranged in a row direction, but other than that, the pixel has a similar structure to that of the pixel shown in FIG. 9A. In other words, equivalent circuit diagrams of both pixels shown in FIGS. 9A and 9C are the same. However, each power supply line is formed using a conductive layer in a different layer when the power supply line 1412 is arranged in a column direction (FIG. 9A) and when the power supply line 1412 is arranged in a row direction (FIG. 9C). Here, a wiring to which the gate electrode of the driver TFT 1403 is connected is focused and the figures are separately shown in FIGS. 9A and 9C to show that the wirings are formed in different layers.

In the pixels shown in FIG. 9A and FIG. 9C, the driver TFT 1403 are connected in series to the current control TFT 1404. A channel length L(1403) and a channel width W(1403) of the driver TFT 1403 and a channel length L(1404) and a channel width W(1404) of the current control TFT 1404 are preferably set to satisfy L(1403)/W(1403): L(1404)/W(1404) =5 to 6000:1.

Note that the driver TFT 1403 operates in a saturation region and has a role of controlling the amount of electric current flowing to the light emitting element 1405, and the current control TFT 1404 operates in a linear region and has a role of controlling supply of electric current to the light emitting element 1405. It is preferable from the viewpoint of the manufacturing steps that both TFTs have the same conductivity. In this embodiment, the TFTs are formed to be n-channel TFTs. Further, the driver TFT 1403 may be a depletion mode TFT as well as an enhancement mode TFT. In the present invention having the above structure, the current control TFT 1404 operates in a linear region, so that slight variation in Vgs (gate-source voltage) of the current control TFT 1404 does not affect the amount of electric current of the light emitting element 1405. In other words, the amount of electric current of the light emitting element 1405 can be determined by the driver TFT 1403 which operates in a saturation region. According to the above-described structure, luminance variation of the light emitting element, which is caused by variation in characteristics of the TFT, can be improved, and a light emitting device with improved image quality can be provided.

In the pixels shown in FIGS. 9A to 9D, the switching TFT 1401 is a TFT for controlling input of a video signal to the pixel. When the switching TFT 1401 is turned on, the video signal is inputted to the pixel. Then, voltage of the video signal is held at the capacitor element 1402. FIGS. 9A and 9C each show a structure in which the capacitor element 1402 is provided; however, the invention is not limited thereto. When a gate capacitor or the like can be used as the capacitor that can hold a video signal, the capacitor element 1402 may not be provided.

The pixel shown in FIG. 9B has the same structure as the pixel shown in FIG. 9A except that a TFT 1406 and a scanning line 1415 are added. In the same manner, the pixel shown in FIG. 9D has the same structure as the pixel shown in FIG. 9C except that a TFT 1406 and a scanning line 1415 are added.

In the TFT 1406, ON or OFF is controlled by the scanning line 1415 that is newly provided. When the TFT 1406 is turned on, an electric charge held at the capacitor element 1402 is discharged, and the current control TFT 1404 is turned off. In other words, it is possible to make a state in which current is forced not to flow through the light emitting element 1405 by providing the TFT 1406. Therefore, the TFT 1406 can be referred to as an erase TFT. Accordingly, in the structures in FIGS. 9B and 9D, a lighting period can be started simultaneously with or immediately after a start of a write period without waiting for writing of signals in all pixels. Consequently, a duty ratio can be improved.

Figure 9E:
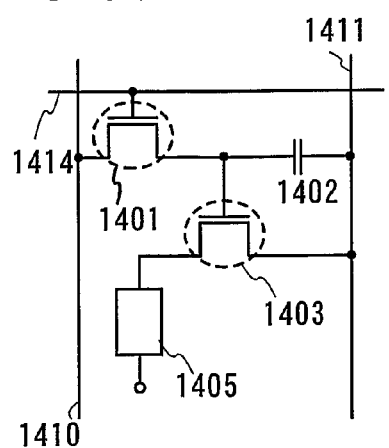
Figure 9F:
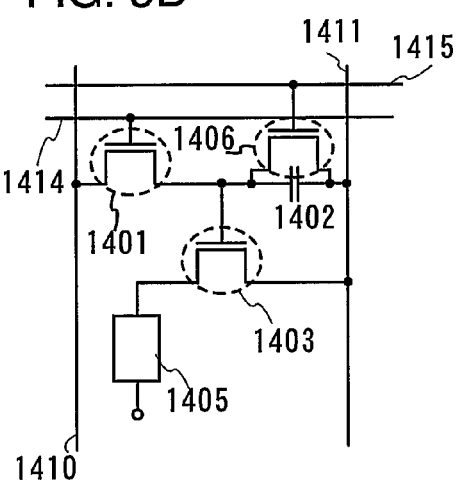

In a pixel shown in FIG. 9E, a signal line 1410 and a power supply line 1411 are arranged in a column direction, and a scanning line 1414 is arranged in a row direction. In addition, the pixel includes a switching TFT 1401, a driver TFT 1403, a capacitor element 1402, and a light emitting element 1405. A pixel shown in FIG. 9F has the same structure as the pixel shown in FIG. 9E except that a TFT 1406 and a scanning line 1415 are added. Note that a duty ratio can be increased by providing the TFT 1406 also in the structure of FIG. 9F.

As described above, various pixel circuits can be adopted. In particular, in the case of forming a thin film transistor with an amorphous semiconductor film, a semiconductor film of the driver TFT 1403 is preferably made large. Therefore, the above-described pixel circuit is preferably a top emission type which emits light from an electroluminescent layer through a sealing substrate.

Such an active matrix type light emitting device is considered to be advantageous to low voltage driving when a pixel density is increased since each pixel is provided with a TFT.

In this embodiment, explained is an active matrix type light emitting device in which each pixel is provided with a TFT. However, a passive matrix light emitting device in which each line is provided with a TFT can also be formed. In the passive matrix light emitting device, a TFT is not provided for every pixel; therefore, a high aperture ratio can be obtained. In the case of a light emitting device which emits light to both sides of an electroluminescent layer, transmittance can be increased by using the passive matrix light emitting device.

The display device of the invention further including such a pixel circuit can be highly reliable since it has superior heat resistance and can be driven stably for a long time. In addition, the display device can have characteristics of each circuit described above.

Subsequently, the case of providing a scanning line and a signal line with a diode as a protective circuit is explained using the equivalent circuit shown in FIG. 9E.

Figure 10:
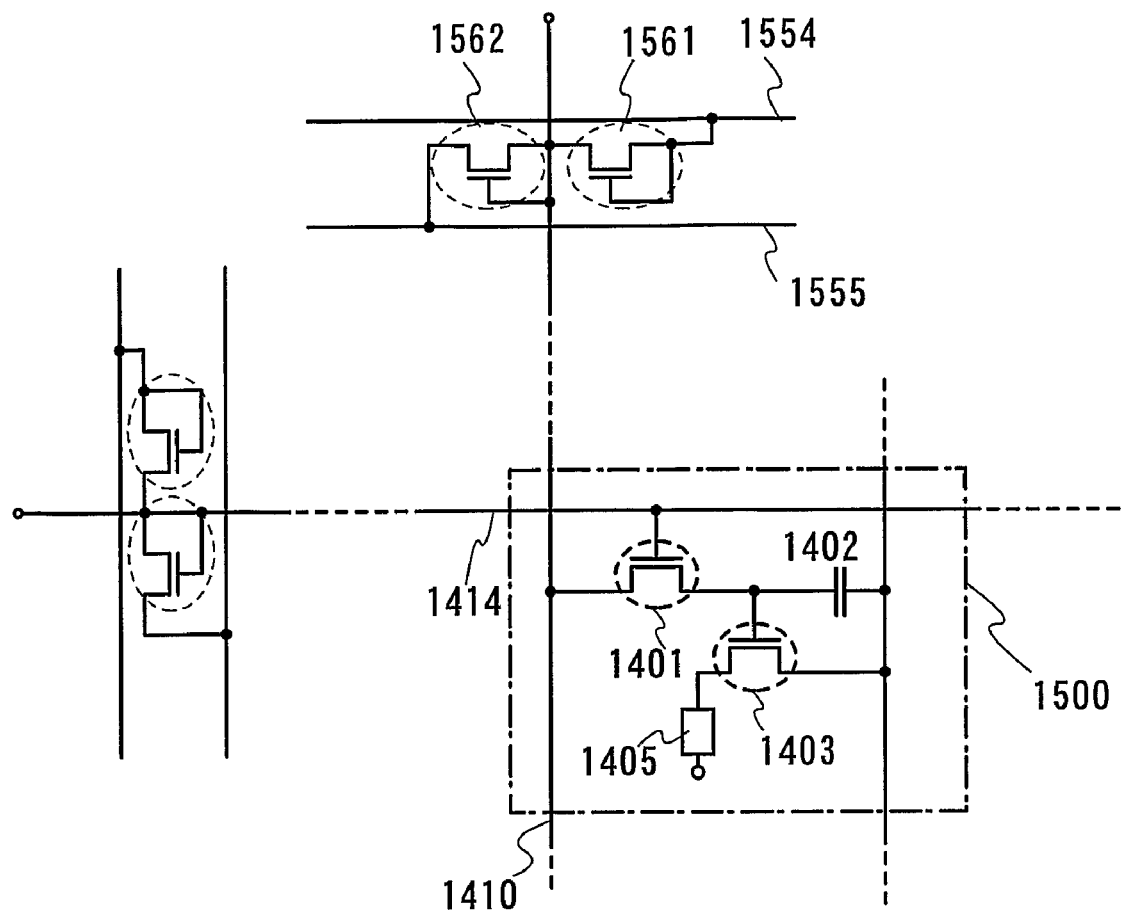
FIG. 10 shows an example of a protective circuit of a display device.

In FIG. 10, a pixel portion 1500 is provided with a switching TFT 1401, a driver TFT 1403, a capacitor element 1402, and a light emitting element 1405. The signal line 1410 is provided with diodes 1561 and 1562. Each of the diodes 1561 and 1562 is manufactured in accordance with the above embodiment as is the case with the switching TFT 1401 or 1403 and includes a gate electrode, a semiconductor layer, a source electrode, a drain electrode, and the like. Each of the diodes 1561 and 1562 is operated as a diode by connecting the gate electrode to the source or drain electrode.

Common potential lines 1554 and 1555 connected to the diodes are formed in the same layer as the gate electrode. Consequently, a contact hole needs to be formed in a gate insulating layer to connect each of the common potential lines to the source or drain electrode of the diode.

A diode provided for the scanning line 1414 also has a similar structure.

Thus, a protective diode provided for an input stage can be formed at the same time according to the invention. Note that a position where a protective diode is formed is not limited thereto. The protective diode can be provided between a driver circuit and a pixel.

A light emitting device of the invention having such a protective circuit is highly reliable since it has superior heat resistance and can be driven stably for a long time. The above-described structure can further increase reliability as a light emitting device.

Example 1

In this example, an example of manufacturing a composite material of the invention is specifically described.
<Manufacturing of Sample of Example>
[1. Synthesis of Alkoxysilane Represented by Structural Formula (1)]

4.85 g (15 mmol) of 4-bromotriphenylamine and 50 ml of tetrahydrofuran (THF) were put in a three-neck 300-ml flask, and 11.39 ml (18 mmol) of n-butyllithium (15% hexane solution) was dropped while stirring in a nitrogen atmosphere at −78° C. After stirring for 30 minutes, 3.67 g (18 mmol) of triethoxy chlorosilane was dropped. After raising the temperature to room temperature and stirring overnight, THF was removed under reduced pressure. Thereafter, hexane was added to precipitate and filter out LiBr. In addition, hexane was removed under reduced pressure. Consequently, 5.9 g of N-(4-triethoxysilylphenyl)-N,N-diphenylamine (abbr.: TPA-Si) represented by Structural Formula (1) was obtained (yield: 96.5%).
[2. Sol Preparation]

Next, in a glove box in which a moisture concentration is maintained at several ppm, 0.421 g (1.0 mmol) of the above-synthesized TAP-Si and 0.139 g (1.0 mmol) of methyltrimethoxysilane (manufactured by Tokyo Kasei Kogyo Co., Ltd.) were measured off and dispersed in 7.43 g (100 mmol) of THF to prepare Solution 1.

Aside from this, in the same glove box, 0.244 g (1.0 mmol) of vanadium triisopropoxide oxide (manufactured by Japan Pure Chemical Co., Ltd.) and 0.136 g (1.0 mmol) of ethyl acetoacetate (manufactured by Kishida Chemical Co., Ltd.) as a stabilizer were measured off and dispersed in 6.89 g (96 mmol) of THF to prepare Solution 2.

In the same glove box, Solution 2 was dropped in Solution 1 while stirring, and then kept stirred for two hours to obtain a sol for forming a composite material of the invention. In this sol, TPA-Si: methyltrimethoxysilane: vanadium triisopropoxide: ethyl acetoacetate: THF=1.0:1.0:1.0:1.0:196 (unit: [mmol]).

[3. Manufacturing of Composite Material of the Invention]

Further, the obtained sol was dropped onto a glass substrate through a 0.45 µm filter, and the substrate was spin-coated at 2000 rpm for 60 seconds. The spin-coated substrate and a beaker of pure water were put in an electric furnace and heated at 70° C. for eight hours for hydrolysis by steam. The beaker of pure water was taken out of the furnace, and baking was performed at 150° C. for 16 hours to obtain a composite material of the invention. In the composite material of this example, an organic group covalently bonded to silicon in a skeleton composed of siloxane bonds is a 4-triphenylamino group, and a material which is capable of accepting or donating electrons from or to that organic group is vanadium oxide.
<Manufacturing of Comparative Sample 1>

For comparison, a sol where vanadium triisopropoxide oxide was removed from the above example was prepared to manufacture Comparative Sample 1. In other words, a sol in which 0.217 g (0.53 mmol) of TPA-Si and 0.072 g (0.53 mmol) of methyltrimethoxysilane were dispersed in 7.40 g (100 mmol) of THF was prepared in the same manner as the above example, and then applied over a glass substrate and baked under similar conditions to manufacture a sample. This Comparative Sample 1 is a conventional organic-inorganic hybrid material not containing vanadium oxide that is a material capable of transferring electrons to and from an organic group (4-triphenylamino group).
<Manufacturing of Comparative Sample 2>

For comparison, a sol where TPA-Si was removed from the above example was prepared to manufacture Comparative Sample 2. In other words, a sol in which 0.072 g (0.53 mmol) of methyltrimethoxysilane, 0.122 g (0.50 mmol) of vanadium triisopropoxide oxide, and 0.067 g (0.51 mmol) of ethyl acetoacetate were dispersed in 7.21 g (100 mmol) of THF was prepared in the same manner as the above example, and then applied over a glass substrate and baked under similar conditions to manufacture a sample. This Comparative Sample 2 is an organic-inorganic hybrid material which has vanadium oxide but not an organic group (4-triphenylamino group) capable of transferring electrons to and from vanadium oxide, and only a methyl group.
<Experimental Result>

Figure 13A:
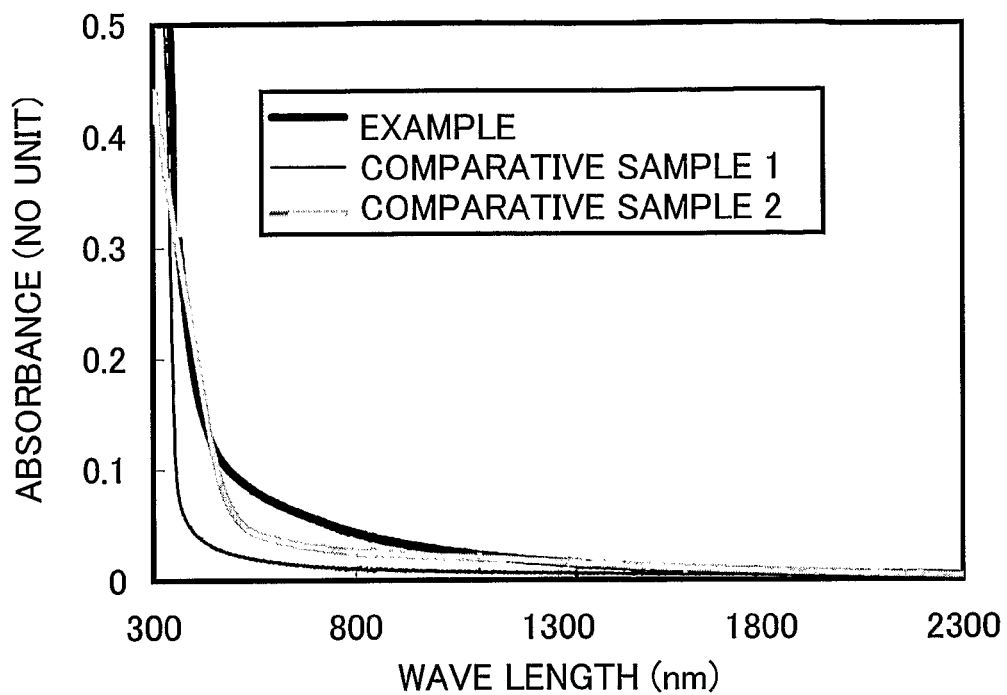
FIGS. 13A and 13B show absorption spectra of a composite material of the invention and a comparative example.

Ultraviolet-visible-infrared absorption spectra of Sample of this example, Comparative Sample 1, and Comparative Sample 2 manufactured as described above were measured using a spectrophotometer (U-4000, manufactured by Hitachi, Ltd.). Results are shown in FIG. 13A. In addition, an enlarged view of spectra in the range of a visible region to a near-infrared region, 400 nm to 1200 nm, is shown in FIG. 13B.

Figure 13B:
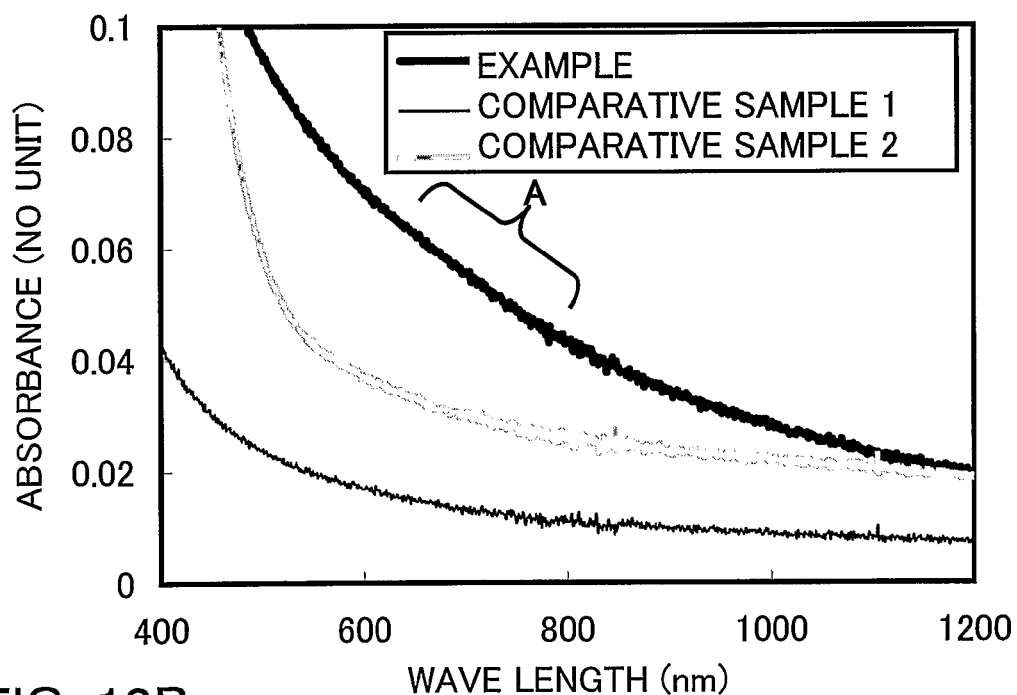

As shown in FIGS. 13A and 13B, the spectrum of Sample of this example has a broader absorption spectrum in the vicinity of a boundary region between visible and infrared, 600 nm to 800 nm, than those of Comparative Examples 1 and 2. Since this broad absorption does not occur in Comparative Samples 1 and 2, it is indicated that charges are transferred between the 4-triphenylamino group and vanadium oxide. Since an arylamino group generally has a highly electron donating property, it is thought that the 4-triphenylamino group serves as an electron donor and vanadium oxide serves as an electron acceptor.

Note that it is known that, in a sol-gel method, an oxide skeleton (metal-oxygen-metal bond) is formed by hydrolysis and baking. In other words, TPA-Si and methyltrimethoxysilane form a siloxane bond, and vanadium triisopropoxide oxide forms a vanadium oxide skeleton. Therefore, according to this example described above, a composite material could be manufactured which has an organic-inorganic hybrid material in which an organic group (4-triphenylamino group) is covalently bonded to silicon in a skeleton composed of siloxane bonds and a material (vanadium oxide) which is capable of accepting or donating electrons from or to the organic group.

EXPLANATION OF REFERENCE

50: Substrate, 52: Semiconductor layer, 53: Gate insulating layer, 54: Gate electrode, 59: Insulating film (hydrogenation film) 60: Interlayer insulating layer, 63: Interlayer insulating layer, 64: Electrode, 65: Partition wall, 66: Light-emitting laminated body, 67: Electrode, 70: Thin film transistor, 88: Resin, 89: Drying agent, 90: Polarizing plate, 91: Protective film, 93: Light emitting element, 94: Opposing substrate, 100: Siloxane bond, 101: Skeleton, 102: Organic group, 103: Organic-inorganic hybrid material, 104: Material, 200: Insulating surface, 201: Electrode, 202: Hole-injecting-transporting layer, 203: Light emitting layer, 204: Electron injecting-transporting layer, 205: Electrode, 206: Hole injecting-transporting layer, 207: Hole injecting-transporting layer, 208: Light emitting layer, 209: Spacing layer, 210: Light emitting layer, 51a: Base insulating layer, 51b: Base insulating layer, 61a: Connecting portion, 61b: Wiring, 1401: Switching TFT, 1402: Capacitor element, 1403: Driver TFT, 1404: Current control TFT, 1405: Light emitting element, 1406: TFT, 1410: Signal line, 1411: Power supply line, 1412: Power supply line, 1414: Scanning line, 1415: Scanning line, 1500: Pixel portion, 1154: Common potential line, 1561: Diode, 2001: Chassis, 2003: Display portion, 2004: Loudspeaker portion, 2101: Main body, 2102: Chassis, 2103: Display portion, 2104: Audio input portion, 2105: Audio output portion, 2106: Operation key, 2108: Antenna, 2201: Main body, 2202: Chassis, 2203: Display portion, 2204: Keyboard, 2205: External connection port, 2206: Pointing mouse, 2301: Main body, 2302: Display portion, 2303: Switch, 2304: Operation key, 2305: Infrared port, 2401: Chassis, 2402: Display portion, 2403: Loudspeaker portion, 2404: Operation key, 2405: Recording medium insertion portion, 4001: Substrate, 4001: Substrate, 4002: Pixel portion, 4003: Signal line driver circuit, 4004: Scanning line driver circuit, 4005: Sealant, 4006: Opposing substrate, 4007: Filler, 4008: Thin film transistor, 4010: Thin film transistor, 4011: Light emitting element, 4014: Wiring, 4016: Connection terminal, 4018: Flexible printed circuit (FPC), 4019: Anisotropic conductive film, 4015a: Wiring, and 4015b: Wiring.

The invention claimed is:

1. A composite material comprising:
an organic-inorganic hybrid material in which an organic group is covalently bonded to silicon in a skeleton composed of siloxane bonds; and
a material which is capable of accepting electrons from the organic group,
wherein the material which is capable of accepting electrons from the organic group is dispersed in the organic-inorganic hybrid material, and
wherein the material which is capable of accepting electrons from the organic group is either or both oxide and hydroxide of transition metal.

2. The composite material according to claim 1, wherein the organic group has a higher hole transporting property than electrons transporting property.

3. The composite material according to claim 1, wherein the organic group has either or both an arylamine skeleton and a pyrrole skeleton.

4. The composite material according to claim 1, wherein one or a plurality of organic groups each having either or both an arylamine skeleton and a pyrrole skeleton is covalently bonded to at least one or a plurality of silicon in the skeleton composed of siloxane bonds.

5. The composite material according to claim 1, wherein the transition metal is selected from the group consisting of metals of Groups 4 to 8.

6. The composite material according to claim 1, wherein the transition metal is selected from the group of consisting of titanium, vanadium, molybdenum, tungsten, rhenium, ruthenium, and niobium.

7. The composite material according to claim 1, wherein the material which is capable of accepting electrons from the organic group is molybdenum oxide.

8. A light emitting element comprising:
a pair of electrodes;
a light emitting layer which emits light when a current flows between the pair of electrodes; and
at least one layer formed with a composite material between the pair of electrodes,
wherein the composite material comprises an organic-inorganic hybrid material in which an organic group is covalently bonded to silicon in a skeleton composed of siloxane bonds, and a material which is capable of accepting electrons from the organic group, and
wherein the material which is capable of accepting electrons from the organic group is dispersed in the organic-inorganic hybrid material.

9. The light emitting element according to claim 8, wherein the light emitting layer comprises a material in which an organic group which emits light by applying voltage is covalently bonded to silicon in the skeleton composed of siloxane bonds.

10. The composite material according to claim 8, wherein the material which is capable of accepting electrons from the organic group is molybdenum oxide.

* * * * *